United States Patent [19]

Phillips

[11] Patent Number: 4,669,866

[45] Date of Patent: Jun. 2, 1987

[54] STEP-AND-REPEAT ALIGNMENT AND EXPOSURE SYSTEM AND METHOD THEREFORE

[76] Inventor: Edward H. Phillips, P.O. Box 1042, Middletown, Calif. 95461

[21] Appl. No.: 695,400

[22] Filed: Jan. 28, 1985

[51] Int. Cl.$^4$ .................... G03B 27/42; G01B 11/26
[52] U.S. Cl. .................................. 355/43; 355/45; 355/53; 356/358; 356/401; 350/444
[58] Field of Search ................... 355/43, 45, 53, 54; 350/444, 445; 356/400, 401, 358, 363

[56] References Cited

U.S. PATENT DOCUMENTS

| | | | |
|---|---|---|---|
| 3,917,399 | 11/1975 | Buzawa et al. | 355/43 |
| 4,171,871 | 10/1979 | Dill et al. | 350/444 |
| 4,311,340 | 1/1982 | Phillips | 356/358 |
| 4,391,494 | 7/1983 | Hershel | 350/442 |
| 4,452,526 | 6/1984 | Johannsmeier et al. | 355/54 X |
| 4,473,293 | 9/1984 | Phillips | 355/53 |

*Primary Examiner*—L. T. Hix
*Assistant Examiner*—D. Rutledge
*Attorney, Agent, or Firm*—Limbach, Limbach & Sutton

[57] ABSTRACT

An improved step and repeat alignment and exposure system for printing an image of a reticle onto a semiconductive wafer. A projection lens, such as a unit magnification catadioptric lens, projects the reticle image onto the semiconductive wafer. Novel viewing port means provide a direct view of a portion of the semiconductive wafer which portion has been illuminated by the projected reticle image. In one embodiment a viewing port is formed in the mirror of a catadioptric lens by way of either a physical aperture or transmissive coatings. Off axis viewing of images through the viewing port is provided to provide telecentric images. Means are also provided for calibrating the position of the stage with respect to the reticle. Means are provided for determining offset values between the projected reticle image and the stage reference mark and for utilizing said offsets in controlling the position of the stage. A novel reticle alignment window array and alignment mark are disclosed which provide both direction and degree of misalignment information without the requirement of relative motion between the reticle and semiconductive wafer. Also employed is a subsystem which is responsive to the relative amounts of light being provided in the image of the alignment mark as a function of the proportion of the alignment mark being illuminated by the images of each of the alignment windows in the array so that a real-time alignment correction can be obtained.

41 Claims, 24 Drawing Figures

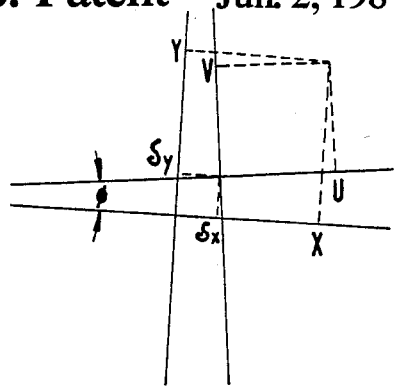
FIG._2.
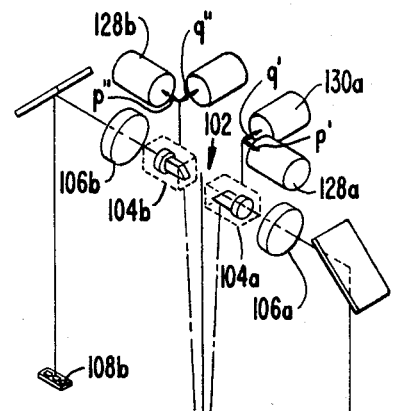
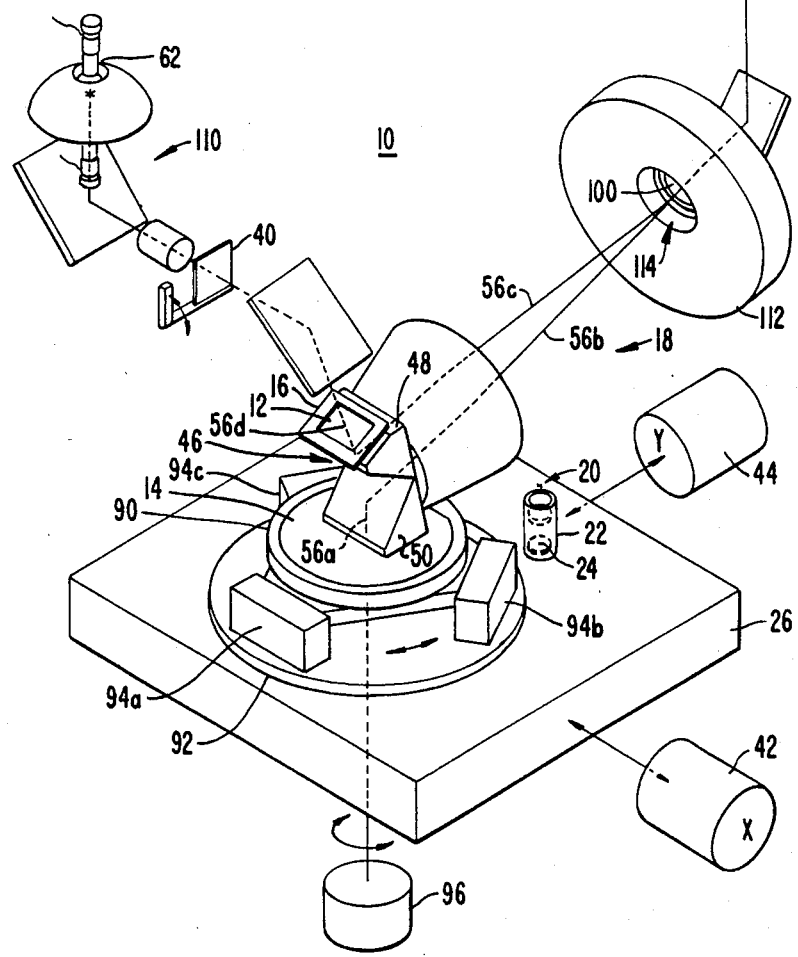
FIG._1.

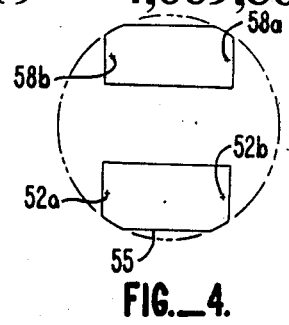
FIG._4.
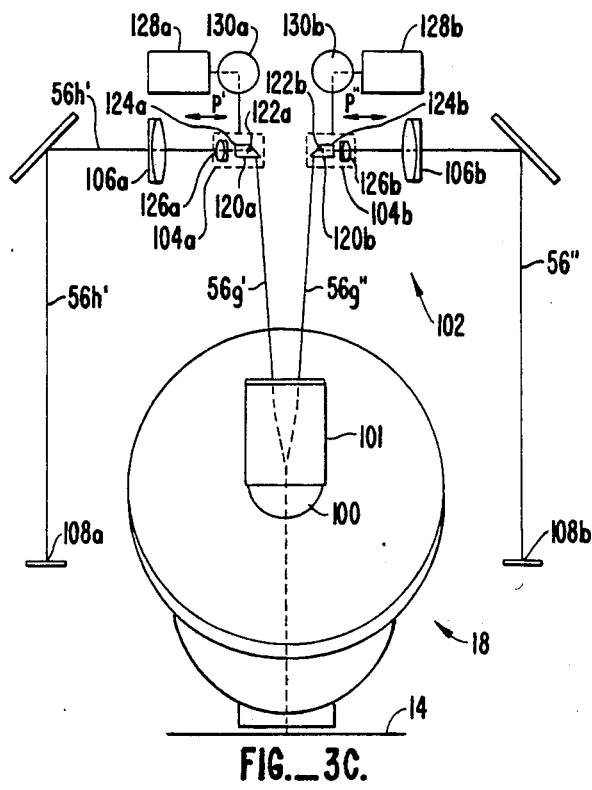
FIG._3C.
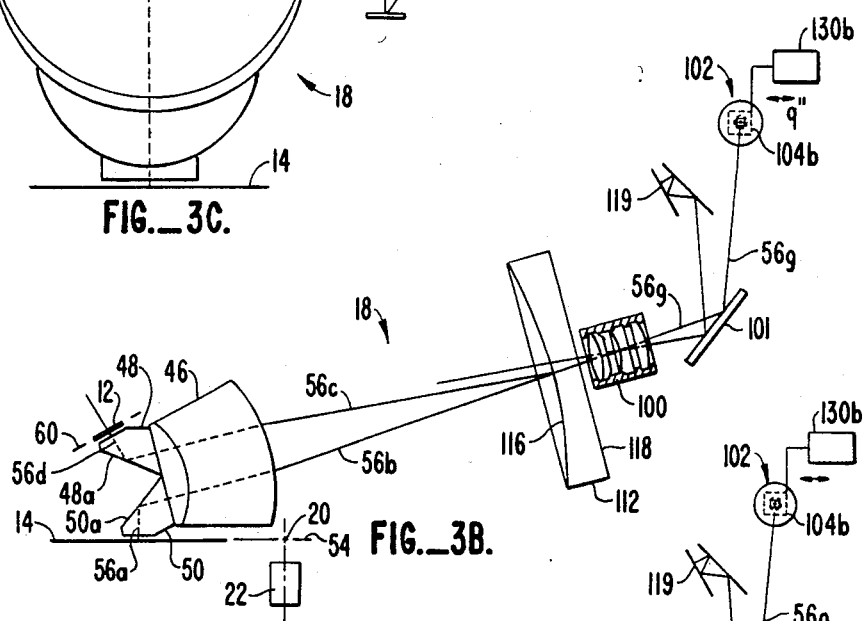
FIG._3B.
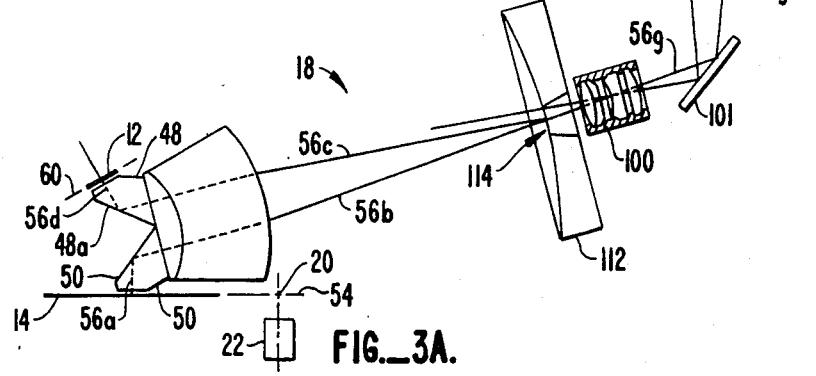
FIG._3A.

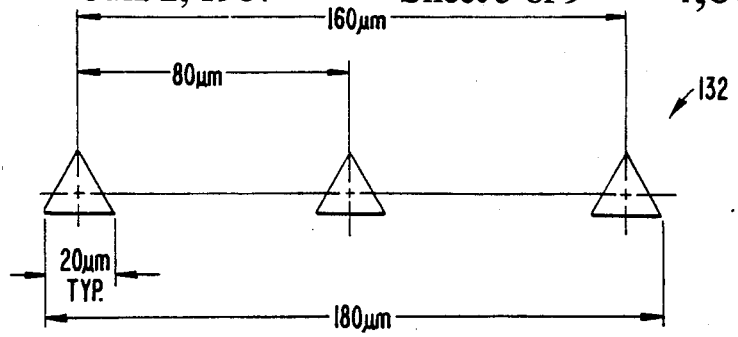
FIG._5A.
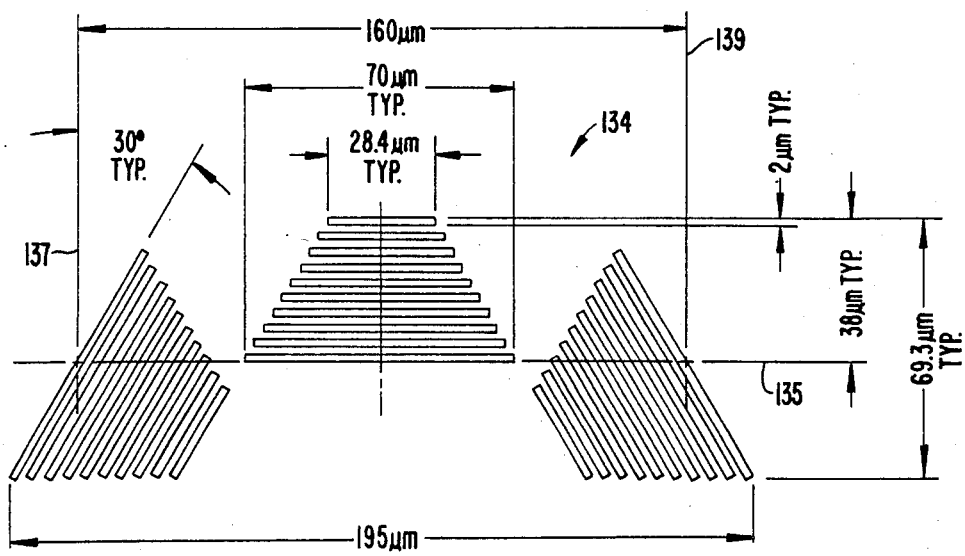
FIG._5B.
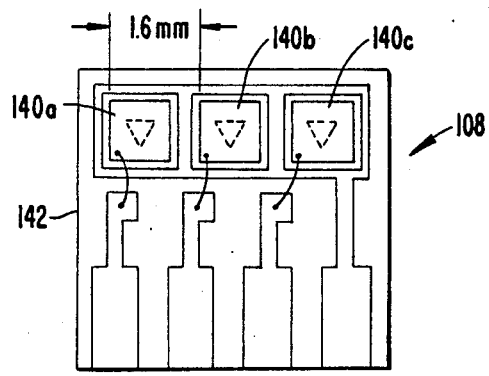
FIG._6.

FIG._7A.  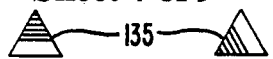
FIG._7B.  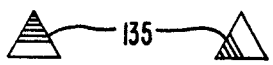
FIG._7C.  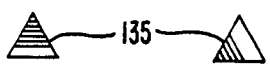
FIG._7D. 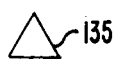 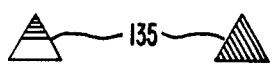
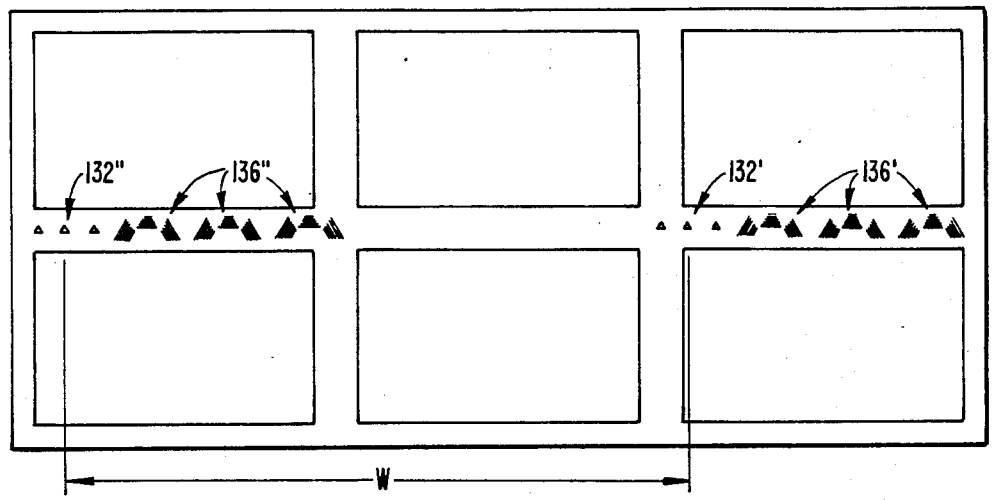
FIG._8.
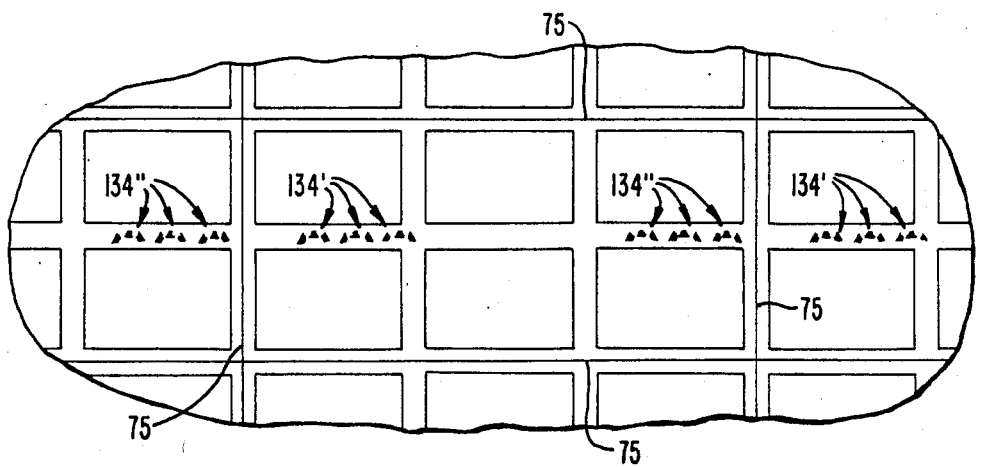
FIG._9.

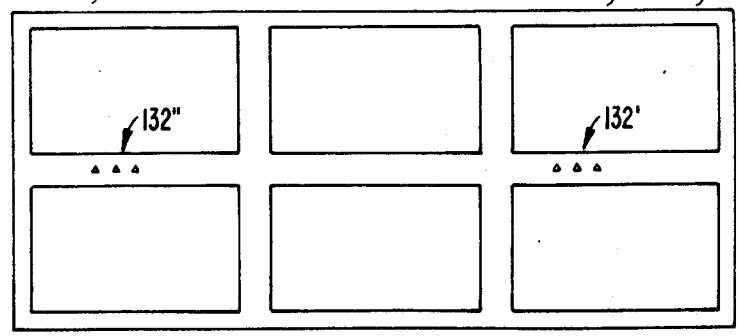
FIG._10A.
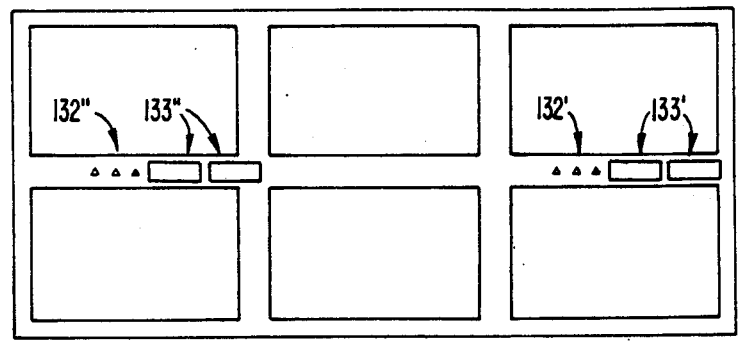
FIG._10B.
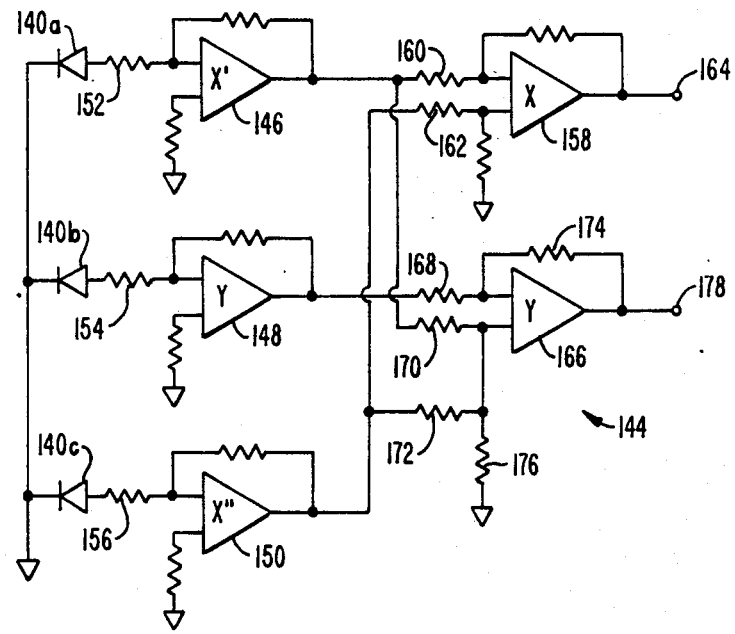
FIG._11.

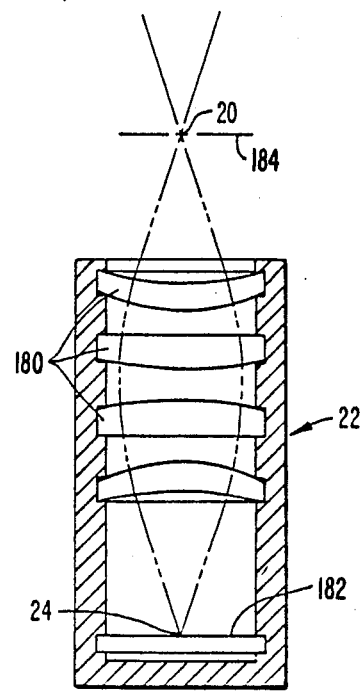
FIG._12.
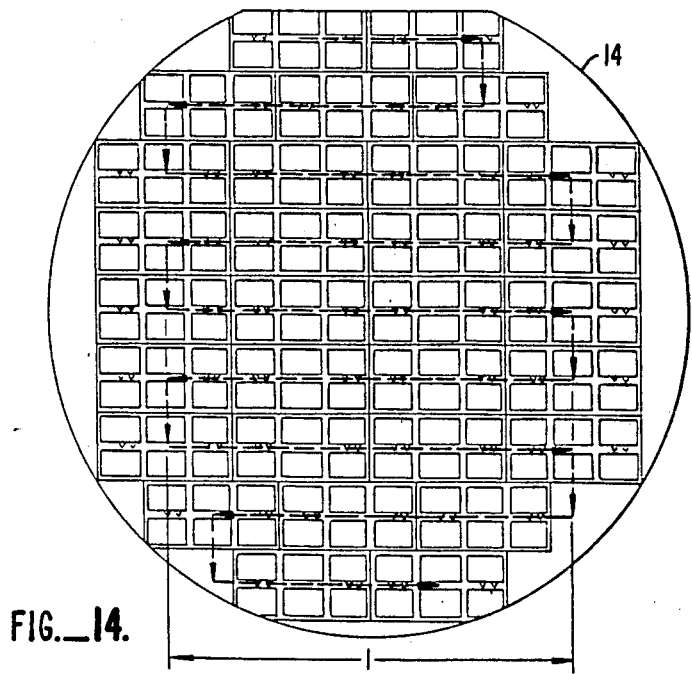
FIG._14.

LOAD RETICLE
AND
CALIBRATE STEP-AND-REPEAT ALIGNMENT SYSTEM

LOAD RETICLE
↓
ALIGN LEFT ILLUMINATED AREA
↓
ALIGN RIGHT ILLUMINATED AREA
↓
CALCULATE OFFSET VALUES ($\delta x, \delta y$ AND $\phi$)

FIRST LEVEL WAFER PROCESSING

LOAD WAFER
↓
ROTATE CHUCK BY $\psi - \phi$
↓
EXPOSE WAFER REGION BY REGION ALONG U AND V AXES
↓
UNLOAD EXPOSED WAFER

HIGHER LEVEL BLIND WAFER PROCESSING

LOAD WAFER
↓
ROTATE CHUCK BY $\psi - \phi$
↓
MOVE TO NOMINAL ADDRESS FOR LEFT REGION
↓
ALIGN REGION AT LEFT
↓
MOVE TO NOMINAL ADDRESS FOR RIGHT REGION
↓
ALIGN REGION AT RIGHT
↓
CALCULATE BEST AVERAGE ALIGNMENT VALUES ($\delta u, \delta v$ AND $\delta \psi$)
↓
EXPOSE WAFER REGION BY REGION ALONG U AND V AXES
CORRECTED BY $\delta u, \delta v,$ AND $\delta \psi$.
↓
UNLOAD EXPOSED WAFER

HIGHER LEVEL ALIGNED WAFER PROCESSING

LOAD WAFER
↓
ROTATE CHUCK BY $\psi - \phi$
↓
MOVE TO NOMINAL ADDRESS FOR FIRST REGION
↓
ALIGN FIRST REGION
↓
EXPOSE FIRST REGION
↓
MOVE TO NOMINAL ADDRESS OF NEXT REGION
CORRECTED BY $\delta u$, $\delta v$ AND $\delta \psi$
↓
ALIGN
↓
EXPOSE
↓
ALL EXPOSED? —— NO
↓ YES
UNLOAD EXPOSED WAFER

---

COMPLETE PROCESSING OF ALL WAFERS IN LOT
↓
UNLOAD RETICLE

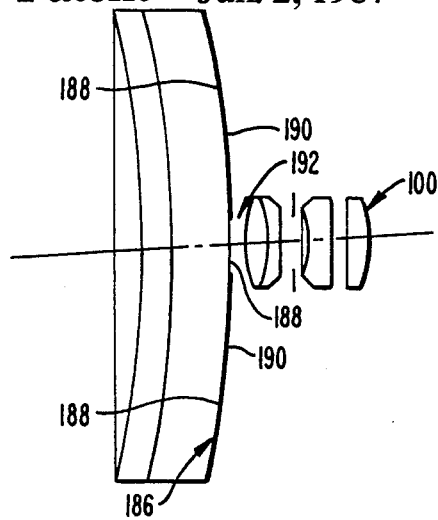
FIG._15A.
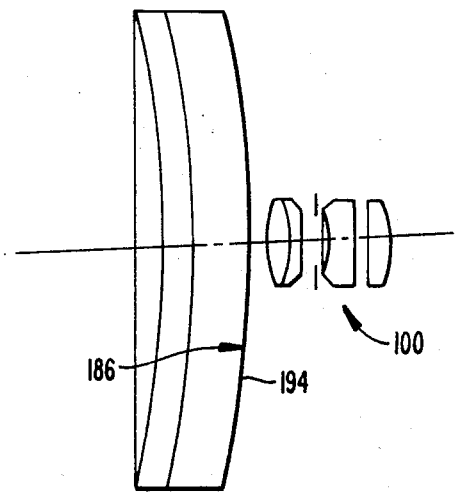
FIG._15B.
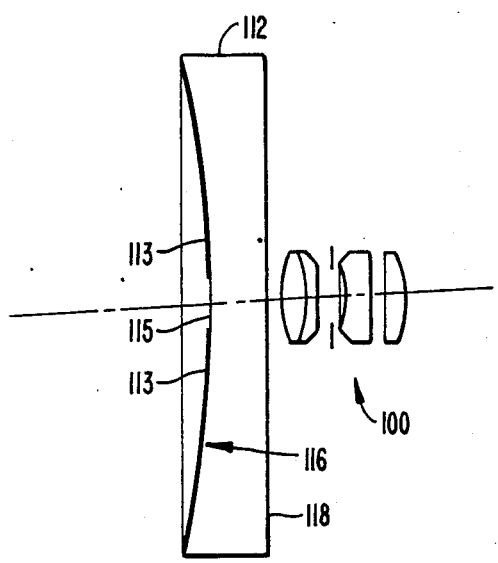
FIG._16.

STEP-AND-REPEAT ALIGNMENT AND EXPOSURE SYSTEM AND METHOD THEREFORE

TECHNICAL FIELD

This invention relates generally to step-and-repeat alignment and exposure systems utilizing a projection lens for printing successive layers of microcircuitry on semiconductive wafers and requiring precise layer to layer alignments. Certain features of the invention make it particularly useful when utilized in conjunction with a projection lens of the unit magnification type, such as the Dyson-Wynne system as shown, for example, in U.S. Pat. No. 4,391,494 entitled APPARATUS FOR PROJECTING A SERIES OF IMAGES ONTO DIES OF A SEMICONDUCTOR WAFER and issued July 5, 1983 to Ronald S. Hershel, or the aberration balanced design shown in U.S. Pat. No. 3,917,399 entitled CATADOPTRIC PROJECTION PRINTER and issued Nov. 4, 1975 to M. John Buzawa and Charles M. Munnelyn, for the photometric printing of an image of a first object, such as a reticle, upon a second object, such as a semiconductive wafer, in a step-and-repeat manner. More specifically, the invention relates to apparatus for use in such systems for achieving precise relative layer to layer alignments of said printed images.

BACKGROUND ART

In the semiconductor industry, step-and-repeat alignment and exposure systems are employed in the processing of semiconductive wafers to form integrated circuits. Very large scale integrated circuits are often fabricated by utilizing a precisely controlled stage to successively position adjacent regions containing an integral number of individual microcircuits on a semiconductive wafer with respect to an image (formed by a projection lens of the step-and-repeat alignment and exposure system) of a reticle containing a next level of microcircuitry that is then printed on the semiconductive wafer at each of those regions. This step-and-repeat printing operation forms an array of adjacent regions of microcircuitry on the semiconductive wafer in rows and columns in an ordered parallel and orthogonal manner. Successive processing of the semiconductive wafer and printing of a further level of microcircuitry, aligned with the preceding processed regions to a high (sub micron) accuracy, are typically employed in the fabrication of integrated circuits from the semiconductive wafer.

Two problems that are critical to all step-and-repeat alignment and exposure systems are the manner in which they receive their alignment signals and the manner in which they perform alignments. Some known prior art systems utilize a tv camera tube to receive an enlarged re-image of an alignment mark, as illuminated by an image of an alignment window, and computer-analyze a time history of signals coming from scan lines of the tube. The computer then commands alignment servos to move a stage of such a step-and-repeat alignment and exposure system a calculated distance along a calculated direction vector in order to reduce alignment error to a predicted minimum. Generally, the system is then required to verify that the alignment has been made satisfactorily. A more detailed description of such tv scanning systems is provided as background material in companion U.S. patent application Ser. No. 692,011, filed Jan. 14, 1985, now U.S. Pat. No. 4,585,337, and entitled IMPROVED STEP-AND-REPEAT ALIGNMENT AND EXPOSURE SYSTEM by Edward H. Phillips and incorporated by reference herein.

Such systems work well, but are slowed by the scan and computation time which requires a serial decoupling of the alignment system from the alignment servos. An example of a system that presents an analog alignment signal is described in detail in the afore mentioned U.S. Pat. No. 4,391,494, incorporated by reference herein. That system utilizes a single detection element (a photomultiplier tube) to sample light intensity reflected from a similarly illuminated alignment mark. Since there is no vectorial information presented by that system, mechanical motion is required to generate alignment information and the resulting iterative alignment process is relatively slow in execution.

What is needed is an alignment system, and utilization method therefore, which presents both amplitude and vectorial information and can operate, together with the alignment servos, in real time.

Another problem faced by many step-and-repeat alignment and exposure systems is the limited acquisition range of their alignment mark systems. Such a limited acquisition range can make it difficult to acquire an alignment signal from a newly loaded wafer. This is because the newly loaded wafer is positioned mechanically on a wafer chuck of the step-and-repeat alignment and exposure system with limited accuracy. The resulting wafer alignment mark location can be outside of the area illuminated by an image of an alignment window of the system with the result that no information is present in its alignment signal.

What is required is a new alignment window and mark system, and utilization method therefore, that characteristically features enlarged acquisition range and preserves the real time operation called for hereinbefore.

In order to facilitate the adaptation of the improved alignment method, and alignment window and mark systems, to a unit magnification catadioptric lens, it would be highly desirable to utilize an improved viewing port and a viewing microscope, to allow direct splitfield microscope viewing of the image of the reticle on the surface of the semiconductive wafer. Such features are not taught by the afore mentioned and incorporated U.S. Pat. No. 4,391,494. The combination of a suitable viewing port and an optimal splitfield microscope for this purpose is taught in the afore mentioned and incorporated U.S. patent application Ser. No. 692,011. Alternately, the splitfield microscope of U.S. patent application Ser. No. 692,011 can be used with yet another improved viewing port presented hereinafter.

Accordingly, it is the principal object of this invention to provide a reticle alignment window array and wafer alignment mark system, and utilization method therefore, which presents both amplitude and vectorial information and can operate, together with alignment servos of a step-and-repeat alignment and exposure system, in real time.

Another object of this invention is to provide the reticle alignment window array and wafer alignment mark system, and utilization method therefore, with features that enlarge its acquisition range and preserve the real time operation called for hereinbefore.

Another object of this invention is to provide an improved viewing port which presents a darkfield image of an image field of a unit magnification catadioptric lens of the step-and-repeat alignment and exposure system for microscope viewing.

Another object of this invention is to provide a viewing port which presents a brightfield image of the image field of the unit magnification catadioptric lens of the step-and-repeat alignment and exposure system for microscope viewing.

Another object of this invention is to provide a microscope system able to present enlarged re-images of selected portions of the image of the image field of the unit magnification catadioptric lens of the step-and-repeat alignment and exposure system present at the viewing port; which allows measurement of the intensity of the light reflected from illuminated portions of the alignment mark by sub-systems adapted for measuring light intensity.

Another object of this invention is to provide sub-systems adapted for measuring the intensity of the light reflected from the illuminated portions of each alignment mark.

Another object of this invention is to provide an electronic system adapted for coupling the outputs of the sub-systems adapted for measuring the intensity of the light reflected from the illuminated portions of each alignment mark into the alignment servos of a stage of the step-and-repeat alignment and exposure system in a manner suitable for aligning the wafer alignment mark within the image of the reticle alignment window array in real time.

Another object of this invention is to provide the stage of the step-and-repeat alignment and exposure system with a stage reference sub-system for providing an alignment reference for an image of the reticle alignment window array by presenting a stage reference mark image when illuminated by the image of the reticle.

Another object of this invention is to provide the step-and-repeat alignment and exposure system with a sub-system for translating and rotating an orthogonal axes of motion of a main stage to achieve compatibility with the actual position and orientation of the image of the reticle.

Another object of this invention is to provide the step-and-repeat alignment and exposure system with a sub-system for globally aligning the semiconductive wafer and shooting "blind".

Another object of this invention is to provide the step-and-repeat alignment and exposure system with a sub-system for aligning each previously processed region of the semiconductive wafer to the image of the reticle prior to photometrically printing the image of the reticle on the region.

Another object of this invention is to provide a method of utilizing the apparatus of the invention to calibrate the apparatus.

Another object of this invention is to provide a method of utilizing the calibrated apparatus of the invention to photometrically print first level semiconductive wafers.

Still another object of this invention is to provide a method of utilizing the calibrated apparatus of the invention to photometrically print higher level semiconductive wafers.

These and other objects, which will become apparent from an inspection of the accompanying drawings and a reading of the associated description, are accomplished by the present invention comprising a main stage controlled for movement in a plane defined by first and second orthogonal axes; a wafer chuck for supporting the semiconductive wafer wherein said wafer chuck is supported on the main stage for rotational positioning about a third axis orthogonal to the first and second orthogonal axes; catadioptric projection lens means for imaging portions of a reticle onto the semiconductive wafer or onto a reference mark associated with the main stage, wherein an optical path is defined through the reticle and catadioptric lens means; a light source for supplying illumination or exposure light; additional imaging lens means supplementing the catadioptric projection lens means and positioned along the optical path for viewing a projected conjugate image of the portions of the semiconductive wafer or reference mark which are illuminated by the projected image of the reticle; means for viewing selected portions of the projected conjugate image; and means for utilizing the viewed selected portions of the projected conjugate image.

More specifically, the above are accomplished according to the illustrated preferred embodiments of this invention by providing an improved step-and-repeat alignment and exposure system and method therefore including a main stage controlled for movement to different positions along orthogonal X and Y axes; a wafer chuck mounted on the main stage and adapted for rotational movement about a third orthogonal Z axis for supporting a semiconductive wafer thereon; an optical subassembly mounted on the main stage for imaging a stage reference mark into the plane of the upper surface, or circuit side, of the semiconductive wafer; a projection lens of the unit magnification catadioptric type for imaging illuminated portions of a reticle onto portions of the semiconductive wafer of the image of the stage reference mark, depending on the position to which the main stage is moved; a light source for directing uniform illumination of exposure light along an optical path extending thru the reticle and the projection lens; a viewing port created by an imaging lens whose aperture is filled by light passing thru a main mirror of the projection lens, either thru a physical aperture hole or a beam splitting coating of the main mirror; so that, at the viewing port, a projected conjugate image may be viewed, wherein the image includes the selected portions of the semiconductive wafer or the image of the stage reference mark, illuminated by the projected image of the illuminated portions of the reticle, in darkfield or brightfield respectively; a pair of novelly constructed, infinity corrected microscope objectives adapted for viewing selected portions of the projected conjugate image; wherein the selected portions are coupled, thru a novel use of the infinity correction principal, to a pair of focusing lenses for re-imaging the viewed, selected portions of the projected conjugate image upon a pair of light sensitive, diode arrays.

The improved step-and-repeat alignment and exposure system and method therefore also includes an alignment sub-system and method able to provide a real time, multidimensional, offset signal representative of the distance and direction required to move the stage to achieve a selected alignment of the image of a reticle alignment window array with either a stage reference mark image or a pair of wafer alignment marks on the semiconductive wafer, so as to minimize stage alignment time.

Also included are a new reticle alignment window array and stage reference or wafer alignment marks with which to implement the alignment sub-system and method, and, able to provide real time alignment and enlarged acquisition range compatible with normal mechanical positioning of the semiconductive wafer on the wafer chuck.

Another sub-system and method are provided which rotate and translate the X,Y co-ordinate axes of motion of the stage into offset and rotated U,V co-ordinate axes of motion of the stage for achieving compatibility with the actual position of the reticle.

A further sub-system and method are provided which provide global alignments and subsequent "blind" shooting of the semiconductive wafer for minimizing wafer processing time.

Finally, a sub-system and method are included which provide regional alignments and immediate exposure of adjacent regions of a semiconductive wafer for minimizing alignment errors.

BRIEF DESCRIPTION OF THE DRAWINGS

FIG. 1 is an isometric view of the different elements of an improved step-and-repeat alignment and exposure system in accordance with the preferred embodiment of the present invention.

FIG. 2 is a graphic representation of two co-ordinate systems of motion utilized by a main stage of the improved step-and-repeat alignment and exposure system.

FIG. 3A is a sectional view of a unit magnification catadioptric lens of the improved step-and-repeat alignment and exposure system.

FIG. 3B is a sectional view of an alternate, unit magnification catadioptric lens of the improved step-and-repeat alignment and exposure system.

FIG. 3C is a sectional view of a microscope associated with either unit magnification catadioptric lens.

FIG. 4 is a graphic representation of a field of view of either unit magnification catadioptric lens.

FIG. 5A is a plan view of a reticle alignment window array employed with the improved step-and-repeat alignment and exposure system.

FIG. 5B is a plan view of a wafer alignment mark employed with the improved step-and-repeat alignment and exposure system.

FIG. 6 is a plan view of a diode array employed with the microscope.

FIG. 7A is a plan view of a properly aligned wafer alignment mark as illuminated by a projected image of the reticle alignment window array.

FIG. 7B a plan view of a wafer alignment mark, misaligned in the X direction, as illuminated by a projected image of the reticle alignment window array.

FIG. 7C is a plan view of a wafer alignment mark, misaligned in the Y direction, as illuminated by a projected image of the reticle alignment window array.

FIG. 7D is a plan view of a wafer alignment mark, misaligned in the X direction in a gross manner, as illuminated by a projected image of the reticle alignment window array.

FIG. 8 is a plan view of a first level reticle employed with the improved step-and-repeat alignment and exposure system and method therefore.

FIG. 9 is plan view of a region of a semiconductive wafer photometrically printed by the unit magnification catadioptric lens.

FIG. 10A is a plan view of a reticle employed with the improved step-and-repeat alignment and exposure system and method therefore for utilization with wafer processing of a positive nature.

FIG. 10B is a plan view of a reticle employed with the improved step-and-repeat alignment and exposure system and method therefore for utilization with wafer processing of a negative nature.

FIG. 11 is a schematic diagram of a diode array signal processing circuit of the improved step-and-repeat alignment and exposure system and method therefore.

FIG. 12 is a sectional view of an optical assembly adapted for imaging a stage mark of the improved step-and-repeat alignment and exposure system and method therefore.

FIG. 13 is a flow chart outlining the procedure followed in utilizing the improved step-and-repeat alignment and exposure system and method therefore.

FIG. 14 is a plan view of a semiconductive wafer as processed by the improved step-and-repeat alignment and exposure system and method therefore.

FIGS. 15A and 15B are sectional views of a main mirror of an alternative unit magnification catadioptric lens which can be used in the improved step-and-repeat alignment and exposure system, and have an apertured, reflective back surface coating and a beam splitting back coating respectively.

FIG. 16 is a sectional view of an alternate method of forming an aperture in the center of the main mirror of the unit magnification catadioptric lens of FIG. 3A.

DESCRIPTION OF THE PREFERRED EMBODIMENTS

Referring now to FIG. 1 there is shown an improved step-and-repeat alignment and exposure system 10 for repeatedly printing one level of microcircuitry, contained on a first object, such as a reticle 12, at an array of adjacent regions of a second object, such as a semiconductive wafer 14, in alignment with other levels of microcircuitry previously printed or yet to be printed at those same regions. Improved step-and-repeat alignment and exposure system 10 includes a slide 16 for holding the reticle 12, a unit magnification catadioptric lens 18 for projecting an image of illuminated portions of the reticle onto the semiconductive wafer 14 or an image point 20 of an optical assembly 22 containing a stage reference mark 24 at its object plane, a main stage 26 for positioning the optical assembly 22 or the semiconductive wafer 14 with respect to a projected image of the illuminated portions of the reticle, an imaging lens 100 for providing a viewing port 102 for viewing projected conjugate images of portions of the semiconductive wafer 14 or the image point 20 illuminated by the projected image of the reticle, a pair of infinity corrected microscope objectives 104a and 104b and a pair of focusing lenses 106a and 106b for imaging selected portions of the projected conjugate image onto a pair of light sensitive diode arrays 108a and 108b, respectively, and a light source 110 for illuminating the reticle with either illumination or exposure light for viewing the projected conjugate image or exposing a photosensitive film on the semiconductive wafer, respectively, as determined by the position of an actinic shutter 40, utilized for eliminating the actinic or exposure wavelengths of light whenever exposures are not being made.

Referring now to both FIG. 1 and FIG. 2, main stage 26 may comprise an interferometrically controlled stage of the type shown and described in detail in U.S. Pat. No. 4,311,390 entitled INTERFEROMETRICALLY CONTROLLED STAGE WITH PRECISELY ORTHOGONAL AXES OF MOTION, issued Jan. 19, 1982 to Edward H. Phillips and incorporated by reference herein. As fully described in that patent, main stage 26 may be moved along orthogonal X and Y axes to any position in a horizontal plane by X and Y axes servo drive units 42 and 44 respectively. The co-ordinate X,Y address is determined by the sequential application of the formulas $$\Delta x = \tfrac{1}{2}\cos\theta(\Delta L_1 - \Delta L_2) \text{ and}$$

$$\Delta y = \tfrac{1}{2}\sin\theta(\Delta L_1 + \Delta L_2)$$

of that patent, where $\Delta L_1$ and $\Delta L_2$ are lengths measured from a predesignated reference point, such as a home position, by a pair of interferometers and $\theta$ is an angle between the Y axis of motion and either of a pair of laser interferometer mirrors of that patent. Normal operation of the stage requires values for $\Delta L_1$ and $\Delta L_2$ to be determined from selected values of $\delta x$ and $\delta y$. $\Delta L_1$ and $\Delta L_2$ may be determined by solving these equations for $\Delta L_1$ and $\Delta L_2$ and deriving the formulas $$\Delta L_1 = \Delta x/\cos\phi + \Delta y/\sin\phi \text{ and}$$

$$\Delta L_2 = \Delta y/\sin\phi - \Delta x/\cos\phi.$$

It is apparent that any system of co-ordinates, U,V, could be utilized for the present system wherein the main stage 26 can be moved to a desired position 11 along offset and rotated U and V axes by the further application of new formulas $$u = (x - \delta x)\cos\phi + (y - \delta y)\sin\phi \text{ and}$$

$$v = (y - \delta y)\cos\phi - (x - \delta x)\sin\phi,$$

where, as illustrated in FIG. 2, $\delta x$ and $\delta y$ are offsets between the average actual and nominal locations of the images of a pair of alignment windows of reticle 12 along the X and Y axes, respectively, and $\phi$ is the angle between a line joining the actual locations of the images of the pair of alignment windows of alignment windows of reticle 12 and the X axis. This offset and rotated system of coordinates is utilized in controlling the position of main stage 26 once the reticle's position has been calibrated as hereinafter explained.

The stage and other servo controlled systems of this invention are controlled by a computer (not shown) as is normal practice in the industry. The computer can be an appropriately programmed general purpose computer or a programmed microprocessor driven computer system.

Microprocessor programming techniques suitable for controlling servo controlled machinery according to the equations presented herein are well known in the industry, and in addition, are competently taught in a series of study courses entitled "Teach Yourself Microprocessors" available from Integrated Computer Systems of Los Angeles, Calif. The courses making up the series are course 525A "Software & Hardware", course 536A "Interfacing Applications" and course 550 "Programming in Basic".

Referring now to FIGS. 1, 3A, 3B, 3C and 4, unit magnification catadioptric lens 18 can comprise a Dyson-Wynne imaging system of the type shown and described in detail in the afore mentioned and herein incorporated U.S. Pat. No. 4,391,494. As fully described in that patent, composite achromat-prism assembly 46 includes prisms 48 and 50 as necessary parts of the optical design and serve the useful function of physically separating its object plane 60 from its image plane 54 via internal reflections from the prism diagonal surfaces 48a and 50a from and toward the reticle 12 and wafer 14 or image point 20, respectively. Light reflected from selected points on the wafer such as alignment marks 52a and 52b, FIG. 4, within image field 55 on image 57 of reticle 12 is transmitted back along optical path 56a, 56b, 56c and 56d and imaged at points 58a and 58b, respectively, in an object field 61 of FIG. 4 where FIG. 4 shows the combined object-image field as it would appear at imaginary line A—A if prisms 48 and 50 were made without diagonal surfaces 48a and 50a but were of the same optical length.

Main mirror 112 has a central zone through which it transmits a portion of the viewing wavelength light that is reflected from the semiconductive wafer 14 or the image of the stage reference mark 24, when said wafer or mark is illuminated by the projected image of the illuminated portions of the reticle 12. The transmitted light is obtained in either a darkfield illumination manner by utilizing a physical aperture 114 in the central zone, or a brightfield illumination manner, by utilizing a beam splitting, multilayer "cold mirror" coated front surface 116, and a polished and anti-reflection coated back surface 118 for the main mirror, as illustrated in FIG. 3A or FIG. 3B respectively. The back surface 118 of the main mirror 112 of FIG. 3B is anti-reflection coated to eliminate unwanted reflections of a portion of the incident viewing wavelength light that can cause "ghosts" to appear in the viewing optics. The light transmitted thru the central zone of the coated front surface 116 is utilized by the imaging lens 100.

The darkfield illumination illustrated in FIG. 3A is obtained via the absence of image forming light projected from the central zone of the main mirror onto semiconductive wafer 14 or stage reference mark 24, and the resulting lack of specularly reflected light from the wafer or stage reference mark which is reflected back toward the central zone of the main mirror. Some of the light that randomly reflects from non-specular surfaces, such as line edges, reflects toward the central zone of the main mirror and passes thru aperture 114.

An alternate method of forming the aperture in the central zone of the main mirror 112 is shown in FIG. 16. In this case there is no physical aperture through the main mirror. Instead, the front surface 116 of the main mirror is coated with two multilayer "cold mirror" coatings. Coating 115 reflects substantially all of the actinic wavelengths and transmits all of the viewing wavelengths and covers the whole mirror surface while coating 113 reflects substantially all of both the actinic and viewing wavelengths but is formed only on the annular area of the main mirror surrounding the central zone. This alternate method of forming the darkfield illuminating main mirror has the advantage of utilizing the entire surface of the main mirror to reflect the actinic wavelengths and thus increase the amount of light available for exposures. The viewing wavelengths are reflected from the annular area and transmitted through the central zone as before. Also, the back surface of the main mirror is anti-reflection coated to eliminate unwanted reflections as described hereinbefore. In this embodiment, the main mirror is dioptrically uncorrected.

Conversely, the brightfield illumination illustrated in FIG. 3B is obtained via the presence of image forming light projected from the central zone of the main mirror onto the semiconductive wafer 14 and the resulting presence of specularly reflected light reflected from the semiconductive wafer 14 and back toward the central zone of the main mirror. In this case the beam splitting, multilayer "cold mirror" coating on the front surface 116 of the main mirror is designed to reflect substantially all of the actinic wavelengths and half of the viewing illumination wavelength of 546 nm, generated by the "F" line of a mercury arc lamp 62 utilized in light source 110, toward the image plane 54 of unit magnification catadioptric lens 18 and transmit the other half thru main mirror 112. Similarly, half of the viewing illumination wavelength light reflected from the image plane 54 and toward the main mirror is transmitted thru the main mirror. Thus, twenty-five percent of the viewing light first incident upon the central zone of main mirror 112 is the maximum possible amount of light that can be transmitted back thru the main mirror from image 57 of reticle 12.

For either darkfield or brightfield illumination, the reflected viewing light transmitted thru the central zone of the main mirror is imaged by imaging lens 100 along an extension of optical path 56b, identified herein as optical path 56g, to create viewing port 102. Mirror 101 is placed in optical path 56g to change the direction of optical path 56g so that light traveling along said path is incident upon infinity corrected objectives 104a and 104b. Mounting imaging lens 100 with its aperture's center coincident with optical path 56g, and therefore offset from the axial center line of unit magnification catadioptric lens 18, means that the light it images at viewing port 102 passes concentrically thru the central zone of the front surface curvature of the main mirror 112 of the unit magnification catadioptric lens and therefore represents a telecentric sampling of the light reflected from the surface of wafer 14.

Telecentric sampling of the light reflected from the surface of the wafer is desirable because line edge reflections can then be treated equally without regard to angular orientation of the line edge in the X,Y plane. Since alignment accuracy is dependent on the intensity of the line edge reflections, as described hereinafter, this means that alignment accuracy is improved.

Because maximum resolution is desired at viewing port 102, it is necessary to design imaging lens 100 to enable the formation of a diffraction limited image. The design of the imaging lens is influenced by glass transmission portions and curved surfaces of the unit magnification catadioptric lens which can include the main mirror as described hereinbefore or dioptric correctors for the main mirror as described hereinafter. The design of the imaging lens is similar in concept to a photographic "macro" lens such as a Pentax SMC Pentax-M Macro 50 mm f/4 but somewhat simplified since it operates at a fixed aperture of about f/16, requires about a 200 mm focal length with about a 35 mm diameter field, and operates at a fixed image-to-object ratio of about 1:1. An imaging lens such as described above can be readily obtained, upon order, from any one of a large number of lens manufacturing companies, such as the Tropel Div. of GCA of Fairport, N.Y.

Light incident upon the imaging lens 100 that comes directly from reticle 12 and is directed along optical path 56c must be removed from the microscope system without any stray reflections reaching the light sensitive diode arrays. Otherwise, the signal to noise ratio of detection signals derived from the light sensitive diode arrays is degraded. The unwanted light energy is eliminated by being trapped in light trap 119 as shown in both FIG. 3A and FIG. 3B.

The unit magnification catadioptric lens of incorporated U.S. Pat. No. 4,391,494 is limited in that it is not chromatically corrected to a high degree. Thus, images formed with light of 546 nm are somewhat out of focus. This out of focus condition may actually be helpful in the functioning of the analog alignment system of that patent. To improve the viewed image quality, a more highly corrected unit magnification catadioptric lens can be employed which is of the same generic type and is taught in U.S. Pat. No. 4,171,871 entitled ACHROMATIC UNIT MAGNIFICATION OPTICAL SYSTEM, issued Oct. 23, 1979 to Frederick H. Dill, Raymond E. Tibbetts and Janusz S. Wilczynski and incorporated by reference herein.

Different methods of forming the physical aperture in, or the beamsplitting surface of, the main mirror are required if the unit magnification catadioptric lens of U.S. Pat. No. 4,171,871 is utilized. This is because the main mirror of that patent is formed as a reflective coating on a back surface 186 of a large correcting lens which is a component part of that lenses' optical design.

FIGS. 15A and 15B illustrate methods of forming a physical aperture in, or a beamsplitting surface of, the main mirror of that patent, respectively. In FIG. 15A the back surface 186 is coated with a multilayer "cold mirror" coating 188 that reflects substantially all actinic wavelengths and transmits substantially all viewing wavelengths. The back surface is further coated with a coating reflective to viewing wavelengths 190 and with an aperture 192 in its central zone. Thus substantially all of the actinic wavelengths can be efficiently utilized for exposure while substantially all the viewing wavelengths incident on the central zone of the main mirror are transmitted to enable effective dark field illumination and efficient viewing.

Conversely, the coatings can be modified to form the beamsplitting surface shown in FIG. 15B wherein the back surface 186 is coated with a multilayer "cold mirror" coating 194 that reflects substantially all actinic wavelengths and forms a 50-50 beamsplitter for viewing wavelengths. Such coating are also known as "long wave pass" or LWP coatings and their half maximum wavelength can be fine-tuned by slight modifications to their individual layer thicknesses. For instance, the coating on LWP Edge Interference Filter 03 LWP 005, available from Melles Griot, Optical Components Division of Irvine, Calif., is designed with a half maximum wavelength of 550 nm. This coating can be modified slightly to shift its half maximum wavelength to 546 nm in order to form the 50-50 beamsplitter at the viewing wavelength, 546 nm, provided by the "F" line of mercury arc lamp 62 of light source 110. Modifications such as these can be readily implemented by any number of optical equipment manufacturers and/or optical coaters such as Melles Griot, identified above.

Thus, in either case, the unit magnification catadioptric lens of U.S. Pat. No. 4,171,871 can be utilized for the step-and-repeat alignment and exposure system.

Viewing port 102 is viewed by prism-lenses 120a and 120b which bend (by total internal reflection) the light transmitted along paths 56g' and 56g" and internally form projected, conjugate images 122a and 122b along optical paths 56h' and 56h" respectively as shown in FIG. 3C.

Magnified images of the projected, conjugate images 122a and 122b are formed on the light sensitive diode arrays 108a and 108b by the combination of infinity corrected microscope objectives 104a and 104b and focusing lenses 106a and 106b, respectively. Objective 104a comprises that portion of a transparent sphere formed by the portion of prism-lens 120a between image 122a and convex surface 124a and doublet 126a. Similarly, objective 104b comprises that portion of a transparent sphere formed by the portion of prism-lens 120b between image 122b and convex surface 124b and doublet 126b. The transparent spheres may be visualized by observing dotted lines 125a and 125b. An axial length, -s, between image 122a and convex surface 124a, or image 122b and convex surface 124b is chosen according to the formula $$-s = r(n+1)/n.$$

Virtual images of the projected, conjugate images 122a and 122b are formed at an axial length, s', in front of the convex surfaces 124a and 124b according to the formula $$s' = r(n+1).$$

These virtual images are analogous to those formed by the first element of high power microscope objectives of the oil immersion type and are free of both spherical aberration and coma. Doublets 126a and 126b are positioned with their focal points coincident with the virtual images, to comprise the remainder of the infinity corrected objectives 104a and 104b. Infinity corrected objectives 104a and 104b may be translated anywhere along orthogonal axes p' and q' and p'' and q'' within viewing port 102, subject to the obvious limitation that they cannot physically interfere with each other, by p', p'', q' and q'' servo drive units 128a, 128b, 130a and 130b respectively. The servo drive units position the infinity corrected objectives along p' and q' axes and p'' and q'' axes by utilizing two axes stages (not shown) with position feedback provided by position measuring transducers such as linear potentiometers (not shown) and controlled by the computer (not shown).

Focusing lenses 106a and 106b have clear apertures large enough to pass all of the light transmitted along optical paths 56h' and 56h'' regardless of the positions of the infinity corrected objectives. Since the light passing between infinity corrected objectives 104a and 104b and focusing lenses 106a and 106b is collimated, axial motion between them has no effect on the location or character of images formed by the focusing lenses as is well known and widely used in the microscope industry. One pertinent example of such use is the model MJM splitfield microscope manufactured by Carl Zeiss and utilized in semiconductive wafer aligners for alignment viewing for many years. Not previously used in the industry, however, to the knowledge of the applicant, but taught in companion U.S. patent application Ser. No. 692,011, is the fact that lateral motion between the infinity corrected objectives and focusing lenses has no effect on the location or character of the images formed by the focusing lenses either and use is made of this new principle herein to accommodate transverse motion of the infinity corrected objectives without concomitant motion of either the focusing lenses or the images formed by the focusing lenses. Thus, the combination of infinity corrected objectives 104a and 104b and focusing lenses 106a and 106b, faithfully form magnified images of the projected, conjugate images 122a and 122b on light sensitive diode arrays 108a and 108b with magnification substantially equal to the ratio of the focal lengths of the focusing lenses 106a and 106b to the focal lengths of the doublets 126a and 126b respectively. Normal programming procedures for the improved step-and-repeat alignment system 10 include positioning the infinity corrected objectives such that images 122a and 122b coincide with light returning from areas on the semiconductive wafer 14 or the image point 20 that are to be aligned, as hereinafter explained.

Referring now to FIG. 5A, FIG. 5B and FIG. 6 there are shown a reticle alignment window array 132, a wafer alignment mark 134 and a light detector device, respectively. Preferably, the light detector device is analog in nature. Such a feature is provided by diode array 108. The reticle alignment window array consists of three windows, the wafer alignment mark consists of three sets of lines oriented along three different axes, and the diode array consists of three photodetecting diodes 140a, 140b and 140c. The orientation of the lines is chosen with respect to the layout of the three windows such that when the wafer alignment mark is properly positioned an equal portion of each set of lines will be illuminated by the projected image of one of the illuminated windows. From another point of view, the alignment mark 134 comprises an array of three alignment patterns, where each of the alignment patterns is positioned in a predetermined orientation to the other marks. Thus, as can be seen from FIG. 5B, three alignment patterns are provided, each comprising a set of lines. Preferably, the patterns are identical. The center pattern has its longest line positioned along an axis 135 and shorter lines positioned above axis 135. The left-hand pattern is positioned with its longest line crossing axis 135, but rotated so that its longest line is approximately 30° from an axis 137. Axis 137 is orthogonal to axis 135. Thus, for the left-hand pattern, each of the lines are inclined toward the center pattern. Finally, the right-hand pattern is rotated approximately 30° with respect to an axis 139 which is orthogonal to axis 135, and its lines are inclined toward the center pattern. The preferred pattern dimensions are provided in FIG. 5B.

When the light reflected from each of the illuminated wafer alignment mark areas is viewed by the viewing system, during wafer alignment, it is imaged into the viewing port 102 and re-imaged onto one of the photodetecting diodes. As fully described hereinafter, a combined output signal of the diode array 108 is differentially coupled into a real time alignment servo of the step-and-repeat alignment and exposure system to maintain said proper positioning. Further, when the wafer alignment mark is improperly positioned, resulting differential amounts of light are reimaged onto the photodetecting diodes. This results in a differential combined output signal of the diode array which is coupled into the real time alignment servo. The real time alignment servo then establishes proper positioning. This is accomplished even if the improper positioning is gross in nature and one or two of the projected images of the illuminated windows illuminates a portion of the wafer alignment mark entirely containing lines and/or one of two of the projected images of the illuminated windows illuminates a portion of the wafer alignment mark entirely devoid of lines as is also hereinafter explained in detail.

The relative positioning of the three sets of lines, or alignment patterns, in the alignment mark 134 is chosen in light of the relative positioning of the windows in the alignment window array 132 to provide a predetermined relative intensity relationship. In accordance with this relationship, the amount of light contributed by each alignment pattern to the image of the alignment marks (which results when they are illuminated by the image of the alignment windows) is a function of the direction and degree of misalignment between the image of the alignment window array 132 and the alignment mark 134. Thus, as can be appreciated from FIGS. 7A thru 7D, the proportion of each of the alignment patterns which is illuminated by the image of the alignment windows is a function of the direction and degree of misalignment.

The hereinbefore described alignment mark system, and utilization method therefore, is powerful in concept because it combines selectably high resolution and theoretically unlimited acquisition range, as determined solely by the chosen window and mark dimensions. It has possible application for any two dimensional, optical overlay alignment use and could easily be implemented with many types of optical alignment systems.

A particularly appropriate system for such implementation is fully described in companion U.S. patent application Ser. No. 692,011 referenced and incorporated hereinbefore. This system utilizes a unit magnification catadioptric lens coupled to an alternate viewing port. The alternate viewing port is created by a beam splitting "cold mirror" coating on surface 48a of FIGS. 3A and 3B and an additional prism of that patent. The light viewed at the viewing port is full aperture derived light from the main mirror of the lens rather than just central zone derived light and is perhaps an order of magnitude brighter because of the difference in aperture area. Also, there is no incident light coming directly from the light source (through the reticle) that must be trapped as described hereinbefore. These factors are desirable because they contribute to an improved optical signal to noise ratio. However, both viewing systems have merit because darkfield illumination is not possible with the system of U.S. patent application Ser. No. 692,011 and, depending on the type of wafer and manner of processing, may not yield a higher optical signal to noise ratio than the system described herein.

Another particularly appropriate system for such implementation is detailed at great length in U.S. Pat. No. 4,452,526 entitled STEP-AND-REPEAT PROJECTION ALIGNMENT AND EXPOSURE SYSTEM WITH AUXILIARY OPTICAL UNIT, issued June 5, 1984 to Karl-Heinz Johannsmeier and Edward H. Phillips and incorporated by reference herein, and U.S. Pat. No. 4,473,293 entitled STEP-AND-REPEAT ALIGNMENT AND EXPOSURE SYSTEM, issued Sept. 25, 1984 to Edward H. Phillips and incorporated by reference herein. This prior art system utilizes a projection lens of the reduction type and features a viewing port, serving substantially the same purpose as viewing port 102 herein.

In any of the step and-repeat alignment and exposure systems described or incorporated by reference herein a combination of desired resolution of approximately 1/40th m (or about one millionth of an inch) and the practical constraint of wanting to place the wafer alignment mark within an isle between semiconductor circuits of the semiconductive wafer 14, suggests that the preferred reticle alignment window array and wafer alignment mark dimensions be chosen as shown in FIGS. 5A and 5B.

As shown in FIG. 5A, the preferred reticle alignment window array consists of three identical, equilateral, triangularly shaped windows with 20 μm long sides, with said windows located on 80 μm centers and the array having an overall width of 180 μm.

The criteria for choosing the dimensions of the wafer alignment mark are subtle in nature. What is required are features that result in a change in light intensity level detected by the photodetecting diodes as the wafer is aligned. The change can be of either polarity and may be different for any particular exposure level. The change can be due to scatter from line edges, which generally reflect incident light in a direction differing from that of specular reflection, and be positive for darkfield or negative for brightfield, or, it can be due to differing reflectivities for lines and spaces (for brightfield only). In any case, the choice of darkfield verses brightfield, polarity, signal gain and mark configuration is process dependent and is independent of this invention.

As mentioned hereinbefore, the preferred wafer alignment mark is shown in FIG. 5B. It consists of three tightly grouped sets of 2 μm lines and 2 μm spaces; each is ten lines (or 38 μm) long and trapezoidally configured, with a longest line 70 μm wide and the rest of the lines uniformly tapering down to a shortest line length of 28.4 μm. The wafer alignment mark has an overall height of 69.3 μm and an width of 195 μm. Thus, the set of lines corresponding to each alignment window is positioned along an axis which is orthogonal to one of the sides of the image of the alignment window. Mentally superposing FIG. 5A upon FIG. 5B such that the center lines coincide gives a picture of the properly aligned position of the semiconductive wafer 14; and, the resulting illuminated triangular areas of the semiconductive wafer are shown in FIG. 7A. From FIGS. 5A and 5B it can be seen that each set of lines is larger in area than its corresponding alignment window image. Thus, when the alignment mark is located in close proximity to the image of the alignment window, a portion of the image of the corresponding alignment window will be overspanned by the alignment mark. Preferably, the spacing between the alignment windows in the array 132 are at least equal to the size of the alignment window plus the intended acquisition range. Further, it is preferred that the length of the lines in the set of lines be selected to that they continue to overspan the illuminated image of the alignment window over the intended alignment range, such as illustrated in FIG. 7A-D.

FIG. 7B illustrates the case of a semiconductive wafer misaligned in the X direction while FIG. 7C shows a semiconductive wafer misaligned in the Y direction. FIG. 7D shows a semiconductive wafer grossly misaligned in the X direction, as it might be after being mechanically positioned on a chuck 90 supported above a rotational ψ platform 92 by three support assemblies 94a 94b and 94c, and rotationally located by a ψ axis drive unit 96 as shown in FIG. 1.

Referring now to FIGS. 8, 9, 10A and 10B, there are shown a first level reticle, a region of the semiconductive wafer, a higher level reticle and an alternate higher level reticle respectively. Tne first level reticle contains an array of two reticle alignment window arrays 132' and 132" and 2(N−1) wafer alignment mark printing windows 136' and 136" identical in configuration to the wafer alignment mark described hereinbefore. The 2(N−1) wafer alignment mark printing windows 136' and 136" are suitable for printing 2(N−1) wafer alignment marks 134' and 134" in each region, e.g. region 75, of the semiconductive wafer 14, in a photosensitive emulsion coated on the semiconductive wafer, as shown in FIG. 9. This is followed by an etching process that permanently etches the wafer alignment marks, or alternately the area immediately surrounding the wafer alignment marks, into the semiconductive wafer. In the above, N equals the total number of levels of microcircuitry necessary to complete the semiconductive regions on the semiconductive wafer.

Thus each succeeding level of microcircuitry can be aligned and printed with reticles utilizing two reticle alignment window arrays 132' and 132" as shown in FIG. 10A or two reticle alignment window arrays 132' and 132" and 2(N−M) rectangular windows 133' and 133", 80 μm bY 210 μm in size, as shown in FIG. 10B, where M equals the particular level of microcircuitry being printed.

It is necessary to have individual wafer alignment marks for each level of microcircuitry beyond the first because the aligned image of the reticle alignment window arrays overlays the particular pair of wafer alignment marks during exposure and they are distorted or even consumed during processing used for said level. Concomitantly, it is necessary to locate succeeding level reticle alignment window arrays at adjacent positions, in a progressive manner, for succeeding levels to utilize succeeding wafer alignment marks for alignment of said levels. Further, it is necessary to protect unused wafer alignment marks during processing at all levels other than the final level. Thus, reticles having reticle alignment window arrays 132' and 132" according to FIG. 10A would be used whenever that level's processing is of a positive nature, to protect the remaining wafer alignment marks 134' and 134" from being etched during that processing thru windows opened wherever exposures have been made. Reticles having reticle alignment window arrays 132' and 132" and 2(N−M) rectangular windows 133' and 133" according to FIG. 10B would be used whenever that level's processing is of a negative nature, to protect the remaining wafer alignment marks 134' and 134" from being etched during that level's processing thru windows left wherever exposures have not been made.

Viewing illumination wavelength (546 nm) light is utilized for wafer region alignment to avoid random region exposure during alignment. Referring to FIGS. 8-10, the various windows and marks are suitably positioned to be utilized for such semiconductive wafer region alignment, two for each layer, as follows. The light imaged by reticle alignment window arrays 132' and 132" takes the form of two sets of illuminated triangular areas 135 on the semiconductive wafer 14, as shown in FIG. 7A. These sets of areas are aligned as described hereinbefore with respect to a selected pair of sets of the wafer alignment marks 134' and 134", as shown in FIG. 7A. Thereafter, those two sets of marks are destroyed during that level's processing as described hereinbefore.

Referring again to FIG. 6, there is shown one of the diode arrays 108a or 108b which consists of three photodetecting diodes 140 mounted on a ceramic substrate 142. The spacing of the photodetecting diodes 140a, 140b and 140c is determined by the magnifying ratio of the focal lengths of the focusing lenses 106a and 106b to the focal lengths of the doublets 126a and 126b, respectively, (as described hereinbefore and chosen, for instance, to be 20:1 herein) times the magnifying ratio of the imaging lens 100 (chosen, for instance, to be 1:1 herein) times the center-to-center spacing of the light pattern reflected from the illuminated triangular areas on the semiconductive wafer 14 (chosen to be 80 μm hereinbefore) and equal, herein, to 1.6 mm. Photodetecting diodes 140 are preferably of the photovoltaic type, such as the PIN-DP series available from United Detector Technology, 12525 Chadron Avenue, Hawthorn, Calif. 90250 and are mounted upon the ceramic substrate by flow soldering and wire bonding in the normally accepted manner.

Referring now to FIG. 11, there is shown a diode signal processing circuit 144. Diode signal processing circuit 144 receives the signals from diodes 140a, 140b, and 140c and transforms these signals into direction control information, i.e. derives alignment signals, including error components, which can be used to control the position of main stage 26 to align the image of the alignment windows with the alignment mark 134. The outputs of diodes 140a, 140b and 140c are coupled to an x' amplifier 146, a y amplifier 148 and an x" amplifier 150, respectively, thru resistors 152, 154 and 156 respectively. The outputs of x' amplifier 146 and x" amplifier 150 are differentially coupled into X amplifier 158 thru equal valued resistors 160 and 162 respectively. The output of X amplifier 158 at junction 164 is proportional to the differential output of diodes 140a and 140c and is a real time offset signal representative of the required to move the stage in the X direction to achieve alignment in the X direction.

The output of the y amplifier 148 and the outputs of x' amplifier 146 and x" amplifier 150 are differentially coupled into Y amplifier 166 thru resistors 168, 170 and 172 respectively. If the value of resistor 168 is chosen to be one-half that of equal valued resistors 170 and 172, and resistors 174 and 176 are also equal valued; the output of Y amplifier 166 at junction 178 is proportional to the differential output of diode 140b and one-half of the sum of the outputs of 140a and 140c. This is a real time offset signal representative of the distance required to move the stage in the Y direction to achieve alignment in the Y direction. These two real time offset signals comprise a two dimensional output signal of the improved step-and-repeat alignment system and method therefore and are applied to the X and Y servo systems (not shown) of the step-and-repeat alignment system 10. If two sets of two dimensional output signals are generated simultaneously by two of the diode signal processing circuits 144 in response to simultaneous inputs from diode arrays 108a and 108b, they can be combined into a three dimensional output signal as will be fully explained hereinafter.

Alternately, four square shaped windows could be utilized for the reticle alignment window arrays, four tightly grouped sets of lines and spaces could be utilized for the wafer alignment marks, four diodes could be utilized for the diode arrays and suitable modifications could be made to the diode signal processing circuit and the inventive concept would be unchanged. The same could be said of any choice of even higher number of windows and alignment marks. A possible advantage of better signal averaging would have to be weighed against the greater consumption of wafer area and greater complexity.

Referring now to FIG. 12, there is shown optical assembly 22, containing a lens group 180 adapted for imaging stage mark 24, located on an object plane 182 of lens group 180, at image point 20, located on a corresponding image plane 184 of lens group 180. Optical assembly 22 is mounted on the main stage 26, as shown in FIG. 1, and is positioned vertically so that image plane 184 is coplanar with image plane 54 of the unit magnification catadioptric lens 18 as shown in FIGS. 3A and 3B. Stage mark 24 is identical in shape to wafer alignment mark 134, and sized so that its image at image point 20 is the same size as wafer alignment mark 134.

When stage mark 24 is illuminated by light from either of the reticle alignment windows 132' or 132", it performs the same alignment functions described hereinbefore as any wafer alignment mark 134.

The simplified flow chart of FIG. 13 outlines the procedure followed in the utilization of the improved step-and-repeat alignment and exposure system and method therefore. Following the procedure outlined we find reticle 12 loaded into position on unit magnification catadioptric lens 18, step-and-repeat alignment and exposure system 10 calibrated by sequentially aligning the image of stage mark 24 at image point 20 with each of the illuminated arrays 135' and 135", separated by distance w, and the offset values $\delta x$, $\delta y$ and $\phi$ calculated by use of the formulas $$\delta x = \tfrac{1}{2}(\delta x' + \delta x''),$$

$$\delta y = \tfrac{1}{2}(\delta y' + \delta y'') \text{ and}$$

$$\phi = \arcsin (\delta y' - \delta y'')/w;$$

where $\delta x'$ and $\delta x''$ are the X axis alignment errors of illuminated arrays 135' and 135", respectively, as determined by the distances the stage has to be moved to achieve alignment in the x direction, and $\delta y'$ and $\delta y''$ are the Y axis alignment errors of illuminated arrays 135' and 135", respectively, as determined by the distances the stage has to be moved to achieve alignment in the y direction.

Once the reticle is loaded and the step-and-repeat alignment and exposure system calibrated, wafer 14 is loaded onto chuck 90 and wafer processing begun. The locations on the wafer are specified in the U,V system of co-ordinates and the chuck rotated by $\psi = \phi$ before further processing.

If the wafer is to be processed at the first level, the stage is programmed to move region by region thru a serpentine sequence of motions, as shown in FIG. 14, across the image 57 of reticle 12, pausing at each region for an exposure of the image in the photosensitive emulsion coated on wafer 14, along the offset and rotated U and V axes of motion. The required motion of the stage in the X,Y system of co-ordinates along the X and Y axes of motion is found by the formulas $$x = u(\cos \phi) - v(\sin \phi) + \delta x \text{ and}$$

$$y = u(\sin \phi) + v(\cos \phi) + \delta y.$$

If the wafer is to be globally aligned and shot "blind" the stage is programmed to move sequentially to a region on the left where each of the appropriate alignment marks 134' and 134" are aligned, to a "best fit" without $\psi$ rotation, with each of the illuminated arrays 135' and 135", respectively, and a set of left region alignment offsets are determined by the formulas $$\delta y_a = \tfrac{1}{2}(\delta u' + \delta u'') \text{ and}$$

$$\delta v_a = \tfrac{1}{2}(\delta v' + \delta v'');$$

followed by a move, of distance 1, to a region on the right where each of similar appropriate alignment marks 134' and 134" are aligned, to a "best fit" without $\psi$ rotation, with each of the illuminated arrays 135' and 135", respectively, and a set of right region alignment offsets are determined by the formulas $$\delta u_b = \tfrac{1}{2}(\delta u''' + \delta u'''') \text{ and}$$

$$\delta v_b \tfrac{1}{2}(\delta v''' + \delta v'''');$$

followed by a computation of a set of best average alignment offsets determined by the formulas $$\delta u = \tfrac{1}{2}(\delta u_a + \delta u_b),$$

$$\delta v = \tfrac{1}{2}(\delta v_a + \delta v_b) \text{ and}$$

$$\delta \psi = \arcsin (\delta v_b - \delta v_a)/1;$$

and, finally, a programmed move, region by region in a serpentine fashion, exposing each region as described hereinbefore for the first level, with the additional inclusion of the $\delta u$, $\delta v$ and $\delta \psi$ offsets.

If each region is to be aligned and immediately exposed, the stage is programmed to move region by region in the serpentine fashion, aligning the first region by determining alignment offsets by the formulas $$\delta u = \tfrac{1}{2}(\delta u' + \delta u''),$$

$$\delta v = \tfrac{1}{2}(\delta v' + \delta v'') \text{ and}$$

$$\delta \psi = \arcsin (\delta v' - \delta v'')/w;$$

followed by the stage being moved the offset distances; the exposure made; the stage moved to position the next region coincident with image 57 (including calculated offsets $\delta u$, $\delta v$ and $\delta \psi$); and the procedure repeated until the wafer is completely exposed.

Glossary of Symbols

1: The distance, across a wafer, from a first region utilized for global alignment to a second region utilized for global alignment.

L: A length measurement of either of the laser interferometers of the step-and-repeat alignment and exposure system.

mm: Millimeter, a measure of length equal to one thousandth of a meter.

M: The particular level of microcircuitry being printed.

n: The index of refraction of an optical material (in this case a glass).

nm: Nanometer, a unit of measure equal to one billionth of a meter. For instance, the green line of mercury (the "F" line) has a wavelength of 546 nm or 0.0000215 inch.

N: The total number of levels of microcircuitry necessary to complete the semiconductive regions on the semiconductive wafer.

p', p": Horizontal axes of motion of either microscope objective.

q', q": Axes of motion of either microscope objective orthogonal to p', p" respectively.

r: The radius of an optical surface.

s: An axial length between an optical surface and an object related to that surface (in this case an image related to another lens).

s': An axial length between an optical surface and an image related to that surface (in this case a virtual image).

tv: A symbol standing for television.

u: An address along the U axis of motion.

U: An axis of motion of the main stage of the step-and-repeat alignment and exposure system in the horizontal plane at an angle of $\phi$ from the X axis of motion.

v: An address along the V axis of motion.

V: An axis of motion of the main stage of the step-and-repeat alignment and exposure system in the horizontal plane orthogonal to the U axis of motion.

w: The distance from a first reticle alignment window to a second reticle alignment window.

x: An address along the X axis of motion.

X: An axis of motion of the main stage of the step-and-repeat alignment and exposure system directed left to right in the horizontal plane.

y: An address along the y axis of motion.

Y: An axis of motion of the main stage of the step-and-repeat alignment and exposure system directed front to back in the horizontal plane and orthogonal to the X axis.

Z: A vertical axis of the step-and-repeat alignment and exposure system orthogonal to the horizontal plane.

$\Delta$: Delta, a symbol meaning a small offset.

$\delta$: Delta, a symbol meaning a differential change of position along any axis of motion.

$\theta$: Theta, an angle between the Y axis of motion and either of the laser interferometer mirrors of the step-and-repeat alignment and exposure system (nominally 45°). $\mu m$: Micron, a measure of length equal to one millionth of a meter.

$\phi$: Phi, an angle of the horizontal plane between the X and U axes of motion.

$\psi$: Psi, the angle of rotation about the Z axis.

The terms and expressions which have been employed here are used as terms of description and not of limitations, and there is no intention, in the use of such terms and expressions of excluding equivalents of the features shown and described, or portions thereof, it being recognized that various modifications are possible within the scope of the invention claimed.

I claim:

1. Photometric printing apparatus for printing an image from a first object, which first object has non opaque portions, onto a second object, wherein the non opaque portions include a first array of at least three windows having predetermined relative positions, and the second object includes an alignment mark comprising an array of alignment patterns corresponding in number to at least the number of windows in the first array, wherein the alignment patterns have positions with respect to one another which are counterparts of the predetermined relative positions of the windows of the first array, comprising:

a holder for holding the first object;

a stage for holding the second object;

a light source unit, optically disposed on one side of the holder for uniformly illuminating the first object;

an imaging lens, optically disposed on the other side of the holder and between the holder and the stage, for projecting an image of the non opaque portions of the illuminated first object onto the second object along a forward path and for projecting conjugate images of the second object into a conjugate plane along a conjugate path including transmission in a reverse direction along a portion of the forward path;

first optical means, supplementing the reverse imaging capability of the imaging lens, for providing a viewing port to permit viewing of a conjugate image of the second object, wherein the conjugate image is projected along the conjugate path and results when the second object is illuminated by the projected image of the non opaque portions of the first object, so that light passing through each of the windows of the first array is projected onto a counterpart alignment pattern to provide a conjugate image of the illuminated alignment patterns, and further wherein the predetermined relative positions of the windows of the first array are chosen so that different relative proportions of each of the alignment patterns is illuminated when there is a misalignment between the windows and the marks, which relative proportions are a function of the direction of misalignment;

second optical means, optically disposed for viewing a portion of the projected conjugate image and for reimaging the viewed portion of the projected conjugate image onto a conjugate image plane;

means positioned in the conjugate image plane and receiving the conjugate image of the illuminated marks for detecting the proportions of illumination of each of the alignment patterns;

means responsive to the detected portions of illumination for transforming said detected portions into direction control signals; and control means, coupled to the stage, for moving the stage to position the second object in alignment with the image of the first object in response to the direction control signals.

2. Photometric printing apparatus as in claim 1 wherein the second object has a coating of photosensitive emulsion thereon and further wherein the light source unit provides actinic exposure wavelengths and non actinic viewing wavelengths, and, includes:

actinic shutter means disposed for selectively controlling the passage of actinic wavelengths of light to the first object so that the portion of the projected conjugate image can be viewed without random exposure of the photosensitive emulsion coating.

3. Photometric printing apparatus for printing an image from a first object, which first object has non opaque portions, onto a second object, wherein the non opaque portions include a first array of at least three windows having predetermined relative positions, and the second object includes an alignment mark comprising an array of alignment patterns corresponding in number to at least the number of windows in the first array, wherein the alignment patterns have positions with respect to one another which are counter parts of the predetermined relative positions of the windows of the first array, comprising:

a holder for holding the first object;

a stage for holding the second object;

a light source unit, optically disposed on one side of the holder for uniformly illuminating the first object;

an imaging lens, optically disposed on the other side of the holder and between the holder and the stage, for projecting an image of the non opaque portions of the illuminated first object onto the second object along a forward path and for projecting conjugate images of the second object into a conjugate plane along a conjugate path including transmission in a reverse direction along a portion of the forward path;

first optical means, supplementing the reverse imaging capability of the imaging lens, for providing a viewing port to permit viewing of a conjugate image of the second object, wherein the conjugate image is projected along the conjugate path and results when the second object is illuminated by the projected image of the non opaque portions of the first object, so that light passing through each of the windows of the first array is projected onto a counterpart alignment pattern to provide a conjugate image of the illuminated alignment patterns, and further wherein the predetermined relative positions of the windows of the first array are chosen so that different relative proportions of each of the alignment patterns is illuminated when there is a misalignment between the windows and the marks, which relative proportions are a function of the direction of misalignment;

second optical means, optically disposed for viewing a portion of the projected conjugate image and for reimaging the viewed portion of the projected conjugate image onto a conjugate image plane;

means positioned in the conjugate image plane and receiving the conjugate image of the illuminated marks for detecting the proportions of the illumination of each of the alignment patterns;

means responsive to the detected portions of illumination for transforming said detected portions into direction control signals; and control means, coupled to the stage, for moving the stage to position the second object in alignment with the image of the first object in response to the direction control signals, wherein:

each of the alignment patterns comprises a complementary set of lines, wherein the complementary set of lines for a particular alignment pattern is oriented along one of at least three different axes;

each set of lines overspans a portion of the image of a complementary alignment window when the array of alignment patterns is located within closed proximity of the image of the array of alignment windows;

the sets of lines are spaced such that a first line of each set of lines is positioned equally within the illuminated image of each alignment window when the second object is aligned with the image of the first object; and further wherein the reflectivity of the lines in each set of lines is different than the reflectivity of other portions of the second object.

4. Photometric printing apparatus as in claim 3 wherein there is a predetermined acquisition range and further wherein:

the spacing of alignment windows of the array of alignment windows is at least equal to the size of the alignment windows plus the intended acquistion range; and the geometry of the sets of lines is such that each set of lines continues to overspan the illuminated image of each alignment window when positioned laterally with respect to or through the illuminated image of the alignment window over the intended aquisition range.

5. Photometric printing apparatus as in claim 4 wherein there are three alignment windows, three sets of lines, each set corresponding to an alignment pattern, and further wherein the detecting means comprise three analog light detectors.

6. Photometric printing apparatus as in claim 5 wherein the alignment windows are triangular in geometry and the three axes along which the complimentary sets of lines are positioned are each orthogonal to one of the sides of an image of an alignment window.

7. Photometric printing apparatus as in claim 3 wherein third optical means are disposed on the stage for providing an alignment reference for the image of the array of alignment windows of the first object and further wherein the alignment reference is an array of alignment refernce marks substantially identical in configuration to the array of alignment patterns of the second object.

8. Photometric printing apparatus as in claim 7 wherein the third optical means comprise a positive lens grouping for forming the alignment reference by imaging the alignment reference mark into the plane of the image of the first object when illuminated by the image of the array of alignment windows.

9. A method for use in a photmetric printing apparatus of the type for printing an image of a first object, having an array of at least three alignment windows, onto a second object, having an alignment mark comprising sets of lines of selected reflectivity and complementary to an image of the array of at least three alignment windows, wherein the relative positions of the windows of the first array are chosen so that different relative proportions of each of the sets of lines is illuminated when there is a misalignment between the window and the sets of lines, which relative proportions are a function of the direction of misalignment, including a light source for illuminating the first object, a stage for supporting the second object, an imaging lens optically disposed between the first object and the stage for projecting an image of the first object, which image includes the array of at least three alignment windows, onto the second object, which object includes the alignment mark, a viewing port, viewing means, including light detection means which are responsive to the image of the array of three alignment windows, and control means, which are responsive to signals from the light detection means and coupled to the stage; wherein said stage is positionable along X and Y axes relative to the image of the first object; the method comprising the steps of:

a. moving the stage to position the second object such that the alignment mark is nominally aligned with the image of the array of alignment windows;

b. viewing an image of the alignment mark as illuminated by the image of the array of at least three alignment windows with the light detection means, wherein the amount of light provided by the illuminated portions of each of the sets of lines is a function of the direction of misalignment;

c. deriving alignment signals from the illuminated alignment mark image which alignment signals include a differential of the amount of light from the illuminated portions of the sets of lines;

d. controlling the control means to move the stage and the alignment mark of the second object in a manner that substantially results in the nulling of error components in said alignment signals;

so as to position the alignment mark, of the second object, in alignment with the image of the array of at least three alignment window, of the first object, in real time.

10. Photometric printing apparatus for printing an image from a first object, which first object has non opaque portions, onto a second object comprising:
   a holder for holding the first object;
   a stage for holding the second object;
   a light source unit, optically disposed on one side of the holder and providing actinic and viewing wavelengths, for uniformly illuminating the first object;
   a unit magnification catadioptric lens, having a main mirror which is fabricated of non apertured, optically transmissive material and has a central zone defined by a coating, wherein said mirror is optically disposed on the other side of the holder and between the holder and the stage, and further wherein said mirror projects an image of the non opaque portions of the illuminated first object onto the second object along a forward path and projects conjugate viewing wavelength images of the second object into a conjugate plane along a conjugate path, wherein said conjugate path includes transmission in a reverse direction along a portion of the forward path and further includes transmission through the central zone of the main mirror; and
   a positive lens grouping, optically disposed behind the central zone of the main mirror, for providing a viewing port to permit viewing of a conjugate image of the second object, wherein the conjugate image is projected along the conjugate path and results when the second object is illuminated by the projected image of the non opaque portions of the first object.

11. Photometric printing apparatus as in claim 10 wherein the unit magnification catadioptric lens is of the type having a dioptrically uncorrected main mirror and the central zone defining coating is on the front side of the main mirror; wherein the central zone defining coating is layered in a bifurcated manner; and further wherein:
   one of the bifurcated coating layers is a coating which reflects the viewing wavelengths, and which covers an annular region surrounding the central zone of the main mirror; and
   another of the bifurcated coating layers is a multilayer "cold mirror" coating which reflects the actinic wavelengths and which transmits the viewing wavelengths, wherein said multilayer "cold mirror" coating covers at least the central zone of the main mirror.

12. Photometric printing apparatus as in claim 11 wherein the multilayer "cold mirror" covers the whole mirror if the coating covering the annular region of the main mirror is transmissive of the actinic wave-lengths.

13. Photometric printing apparatus as in claim 10 wherein the unit magnification catadioptric lens is of the type having a dioptrically uncorrected main mirror and the central zone defining coating is on the front side of the main mirror wherein:
   the coating is a multilayer "cold mirror" coating, substantially reflective of the actinic wavelengths and partially reflective of the viewing wavelengths.

14. Photometric printing apparatus as in claim 10 wherein the unit magnification catadioptric lens is of the type having a dioptrically corrected main mirror which includes a correcting lens, and in which the main mirror is formed as a reflective coating on the back side of the correcting lens; wherein the coating is layered in a bifurcated manner; and further wherein:
   one of the bifurcated coating layers is a coating, reflective of the viewing wavelengths, covering an annular region which surrounds the central zone of the main mirror; and
   another of the bifurcated coating layers is a multilayer "cold mirror" coating, which is reflective of the actinic wavelengths and transmissive of the viewing wavelengths, and wherein the multilayer "cold mirror" coating covers at least the central zone of the main mirror.

15. Photometric printing apparatus as in claim 14 wherein the multilayer "cold mirror" coating covers the whole mirror if the coating covering the annular region of the main mirror is transmissive of the actinic wavelengths.

16. Photometric printing apparatus as in claim 10 wherein the unit magnification catadioptric lens is of the type having a dioptrically corrected main mirror which includes a correcting lens and in which the main mirror is formed as a reflective coating on the back side of the correcting lens wherein:
   the coating is a multilayer "cold mirror" coating, substantially reflective of the actinic wavelengths and partially reflective of the viewing wavelengths.

17. Photometric printing apparatus as in claims 12, 13, 15 or 16 wherein the positive lens grouping is positioned to be off axis from the optical axis of the main mirror and further wherein a center of an aperture of the positive lens grouping is located on the conjugate path.

18. Photometric printing apparatus for printing an image from a first object, which first object has non opaque portions, onto a second object comprising:
   a holder for holding the first object;
   a stage for holding the second object;
   a light source unit, optically disposed on one side of the holder and providing actinic and viewing wavelengths, for uniformly illuminating the first object;
   a unit magnification catadioptric lens, having a main mirror fabricated with a physical aperture in its central zone, and, optically disposed on the other side of the holder and between the holder and the stage, for projecting an image of the non opaque portions of the illuminated first object onto the second object along a forward path and for projecting conjugate viewing wavelength images of the second object into a conjugate plane along a conjugate path, wherein said conjugate path includes transmission in a reverse direction along a portion of the forward path and further includes transmission through the physical aperture of its central zone; and
   a positive lens grouping, disposed behind the physical aperture of the main mirror and optically positioned to be off axis with respect to the optical axis of the main mirror, wherein a center of an aperture of the positive lens grouping is located on the conjugate path, for providing a viewing port to permit viewing of a conjugate image of the second object, wherein the conjugate image is projected along the conjugate path and results when the second object is illuminated by the projected image of the non opaque portions of the first object.

19. Photometric printing apparatus as in claim 18 additionally comprising a viewing microscope for viewing a portion of the projected conjugate image and for coupling the viewed portion of the projected conjugate image into an optical utilization device.

20. Photometric printing apparatus as in claim 19 wherein the viewing port presents a field of view of the projected conjugate image to an optical utilization device and further wherein the viewing microscope includes:
   an infinity corrected objective; and
   a focusing lens;
   wherein the infinity corrected objective is positioned to couple the light from the viewed portion of the projected conjugate image onto the focusing lens in an infinity corrected manner and the focusing lens is positioned to focus the coupled light coming from the infinity corrected objective at the optical utilization device; and
   further wherein the focusing lens has an aperture larger than the lateral dimension of the field of view of the projected conjugate image of the second object, so that the infinity corrected objective can be utilized to view any portion of the field of view of the projected conjugate image by lateral motion over the field of view of the projected conjugate image of the second object without any concomitant motion of the focusing lens or the optical utilization device 21. Photometric printing apparatus as in claim 20 wherein the infinity corrected objective includes a 90° folding mirror for folding the optical path, and the infinity corrected objective is allowed to move both axially and transversely, with respect to the folded optical path, over the field of view of the projected conjugate image of the second object.

22. Photometric printing apparatus as in claims 19 or 21 wherein an additional viewing microscope is provided and the two viewing microscopes are utilized in a splitfield manner.

23. Photometric printing apparatus as in claim 22 wherein means are disposed on the stage for providing an alignment reference in the plane of the image of the first object when said means are illuminated by the projected image of the non opaque portions of the first object, wherein said alignment reference can be used to align an image of the first object.

24. Photometric printing apparatus as in claim 23 wherein the image of the first object is positioned in a plane and further wherein the means for providing the alignment reference comprise a positive lens grouping for imaging a stage reference mark into the plane of the image of the first object when said stage reference mark is illuminated by the projected image of the non opaque portions of the first object.

25. Photometric printing apparatus as in claim 23 wherein:
   the first object comprises a reticle having at least two means for providing alignment windows so that the image of the non opaque portions of the first object includes images of the alignment windows provided by the alignment window means;
   the alignment reference comprises an alignment mark or an alignment mark image that is complementary to the alignment windows provided by any of the alignment window means;
   the optical utilization devices coupled to each viewing microscope comprise complimentary analog light level detector means for converting the viewing microscope image into corresponding multidimensional electrical signals;
   the apparatus further including:
      control means coupled to the stage for moving the stage along X and Y axes of motion to position the alignment reference relative to the image of the first object; and
      alignment means responsive to the electrical signals and coupled to the control means for actuating the control means until the alignment reference is substantially aligned with the image of the alignment window provided by at least one of the alignment window means.

26. Photometric printing apparatus as in claim 25 wherein:
   the alignment window means comprise an array of at least three alignment windows; and
   further including complementary analog light level detector means for detecting the level of light in the image of the alignment windows, wherein said complementary analog light level detector means comprise complementary arrays of at least three analog light level detectors.

27. Photometric printing apparatus as in claim 25 wherein the second object is a semiconductive wafer having a plurality of regions of microcircuitry including at least a first level of microcircuitry, and wherein each region has at least two wafer alignment marks that are complimentary individually, and as a set, to the reticle alignment window means, further including:
   rotational means coupled to the stage for supporting the semiconductive wafer and for rotating the semiconductive wafer relative to the state;
   additional control means coupled to the rotational means for controlling the rotation of the semiconductive wafer about an orthogonal Z axis to position the semiconductive wafer regions in an orthogonal relationship with a designated offset and rotated U and V axes of motion; and
   additional alignment means responsive to the electrical signals and coupled to both the control means and the additional control means for moving the stage and the rotational means to position the semiconductive wafer such that the wafer alignment marks are aligned with both images of the reticle alignment window means.

28. Photometric printing apparatus as in claim 27 wherein:
   the alignment window means comprise an array of at least three alignment windows; and
   further including analog light level detector means comprising complimentary arrays of at least three analog light level detectors.

29. A method for use in a photometric printing apparatus of the type for printing an image of a reticle, having at least two reticle alignment window means, onto a second object, wherein the photometric printing apparatus includes a light source for illuminating the reticle; a stage for supporting the second object; an imaging lens optically disposed between the reticle and the stage for projecting an image of the reticle, including the reticle alignment windows, onto the second object; a viewing port; viewing means, including light detection means complimentary to the image of the reticle alignment window means for detecting light intensity; and control means, responsive to signals from the light detection means and coupled to the stage for controlling the position of the stage; wherein said stage is positionable along X and Y axes relative to the image of the reticle and includes means for generating a stage reference when said generating means are illuminated by the image of the reticle; the method comprising the steps of:

a. moving the stage to position the generating means such that the alignment reference is nominally aligned with the image of the first reticle alignment window means;

b. determining the position of the stage along the X and Y axes to obtain a nominal x,y address of the image of the first reticle alignment window means;

c. viewing an image of the alignment reference with the light detection means wherein said alignment reference is illuminated by the image of the reticle alignment window means;

d. deriving alignment signals, including error components, from the viewed image of the alignment reference;

e. utilizing the control means to move the stage and the alignment reference in a manner that substantially results in the nulling of error components in said alignment signals;

f. determining $\delta x'$ and $\delta y'$ offset values between the current position of the stage and the nominal x,y address of the image of the first reticle alignment window means;

g. moving the stage to position the generating means such that the alignment reference is nominally aligned with the image of the second reticle alignment window means;

h. determining the position of the stage along the X and Y axes to obtain the nominal x,y address of the image of the second reticle alignment window means;

i. viewing the image of the alignment reference as illuminated by the image of the reticle alignment window means with the light detection means;

j. deriving alignment signals, including error components, from the viewed image of the alignment references;

k. utilizing the control means to move the stage and the alignment reference in a manner that substantially results in the nulling of error components in said alignment signals;

l. determining $\delta x''$ and $\delta y''$ offset values between the current position of the stage and the nominal x,y address of the image of the second reticle alignment window means;

m. designating offset and rotated U and V axes of motion according to the formulas $$u = (x - \delta x) \cos \phi + (y - \delta y) \sin \phi \text{ and}$$

$$v = (y - \delta y) \cos \phi - (x - \delta x) \sin \phi,$$

where $\delta x$, $\delta y$ and $\phi$ are determined by the formulas $$\delta x = \tfrac{1}{2}(\delta x' + \delta x''),$$

$$\delta y = \tfrac{1}{2}(\delta y' + \delta y'') \text{ and}$$

$$\phi = \arcsin(\delta y' - \delta y'')/w$$

where w is the nominal difference in the X addresses of the two images of the reticle alignment window means; so as to calibrate said photometric printing apparatus.

30. The method of claim 29, further for photometrically printing a plurality of levels of microcircuitry succeeding a first level in a plurality of regions of the second object, wherein the second object is positioned on rotational means coupled to the stage for rotating the second object relative to the stage; further including additional control means, responsive to signals from the light detection means and coupled to both the stage and the rotational means; and further wherein the second object is a semiconductive wafer having a coating of photosensitive emulsion, the method further comprising the steps of:

n. photometrically printing the first level of microcircuitry on the semiconductive wafer, including the steps of
  (i) utilizing a first level reticle as the first object, said first level reticle having windows suitable for printing wafer alignment marks;
  (ii) moving the stage in a serpentine fashion under the unit magnification catadioptric lens;
  (iii) stopping at each region of the semiconductive wafer; and
  (iv) making an exposure;

o. processing the semiconductive wafer including the step of etching the wafer alignment marks into the surface of the semiconductive wafer, or the step of etching the area immediately surrounding the wafer alignment marks into the surface of the semiconductive wafer;

p. coating the semiconductive wafer with a photosensitve emulsion;

q. using the next higher level reticle as the first object, said next higher level reticle having reticle alignment window means;

r. positioning the processed semiconductive wafer on the rotational means coupled to the stage;

s. moving the stage into a position of nominal coincidence of the image of the higher level reticle and a region of the processed semiconductive wafer in a first portion of the semiconductive wafer;

t. moving the stage to align the wafer alignment marks to a position of "best fit" with the image of the reticle alignment window means without rotation of the rotational means;

u. determining offset values $\delta u_a$ and $\delta v_b$ between the position of nominal coicidence and the position of "best fit" of step "t.";

v. moving the stage into a position of nominal coincidence of the image of the higher level reticle and a region of the processed semiconductive wafer in a second portion of the semiconductive wafer having a different U address;

w. moving the stage to align the wafer alignment marks to a position of "best fit" of the region with the image of the reticle alignment window means without rotation of the rotational means;

x. determining offset values $\delta u_b$ and $\delta v_b$ between the position of nominal coincidence and the position of "best fit" of step "w.";

y. determining a set of best average alignment offsets according to the formulas $$\delta u = (\delta u_a + \delta u_b),$$

$$\delta v = (\delta v_a + \delta v_b) \text{ and}$$

$$\delta \omega = \arcsin(\delta v_b - \delta v_a)/l$$

where l is the nominal difference in the U addresses of the regions on the first and second portions of the semiconductive wafer;

z. moving the stage in a serpentine fashion under the unit magnification catadioptric lens;

aa. stopping at each region of the semiconductive wafer at a nominal address of the region modified by the set of best average alignment offsets determined in step "y.";

bb. making an exposure;

cc. processing the semiconductive wafer; and dd. repeating the steps of "p." through "bb." for each higher level of microcircuitry to be printed.

31. Photometric printing apparatus for printing an image from a first object, which first object has non opaque portions, onto a second object, the photometric apparatus including:

a holder for holding the first object; a stage, positionable along X and Y axes, for holding the second object; a light source unit, optically disposed on one side of the holder, for uniformly illuminating the first object; an imaging lens, optically disposed on the other side of the holder and between the holder and the stage, for projecting an image of the non opaque portions of the illuminated first object onto the second object along a forward path and for projecting conjugate images of the second object into a conjugate plane along a conjugate path including transmission in a reverse direction along a portion of the forward path; first optical means, supplementing the reverse imaging capability of the imaging lens, for providing a viewing port to permit viewing of a conjugate image of the second object, wherein the conjugate image is projected along the conjugate path and results when the second object is illuminated by the projected image of the non opaque portions of the first object; and second optical means, optically disposed for viewing a portion of the projected conjugate image and for re-imaging the viewed portion of the projected conjugate image onto a second conjugate image plane; characterized by:

the first object having an array of at least three alignment windows having predetermined relative positions, wherein the predetermined relative positions include spacing of the alignment windows, of at least the size of the alignment windows plus the intended acquisition range;

the second object having an array of at least three corresponding alignment patterns, wherein the corresponding alignment patterns have positions with respect to one another which are counterparts of the predetermined relative positions of the alignment windows of the array of alignment windows;

the corresponding alignment patterns having configurations such that different relative proportions of each of the alignment patterns is illuminated when there is a misalignment between the image of the windows and the patterns, which relative proportions are a function of the magnitude and direction of the misalignment;

light detection means positioned in the second conjugate image plane for receiving the conjugate image of the illuminated marks and for detecting the proportions of illumination of each of the alignment patterns; amplifier means responsive to the detected proportions of illumination for transforming said detected proportions into direction control signals; and control means, coupled to the stage, for moving the stage to position the second object in alignment with the image of the first object in response to the direction control signals.

32. Photometric printing apparatus as in claim 31 further characterized by:

each of the corresponding alignment patterns having a complementary set of lines, wherein the complementary set of lines for a particular alignment pattern is oriented along a different one of at least three different axes;

each set of lines overspanning a portion of the image of a complementary alignment window when the array of alignment patterns is located within close proximity of the image of the array of alignment windows;

the sets of lines being spaced such that a first line of each set of lines is positioned equally within the illuminated image of each alignment window when the second object is aligned with the image of the first object and;

the reflectivity of the lines in each set of lines being different than the reflectivity of other portions of the second object.

33. Photometric printing apparatus as in claim 32 further characterized by:

the array of at least three alignment windows having three triangular windows;

the array of at least three corresponding alignment patterns having three sets of lines, each set corresponding to an alignment pattern;

each set of lines being positioned along one of three non parallel axes, which axes are each orthogonal to a different one of the sides of an image of an alignment window; and the detecting means having three analog light detectors.

34. A method for use in aligning a second object with an image of a first object in a photometric printing apparatus of the type for printing an image of the first object onto the second object, including:

a holder for holding the first object; a stage, positionable along X and Y axes; for holding the second object; a light source unit, optically disposed on one side of the holder, for uniformly illuminating the first object; an imaging lens, optically disposed on the other side of the holder and between the holder and the stage, for projecting an image of the non opaque portions of the illuminated first object onto the second object along a forward path and for projecting conjugate images of the second object into a conjugate plane along a conjugate path including transmission in a reverse direction along a portion of the forward path; first optical means, supplementing the reverse imaging capability of the imaging lens, for providing a viewing port to permit viewing of a conjugate image of the second object, wherein the conjugate image is projected along the conjugate path and results when the second object is illuminated by the projected image of the non opaque portions of the first object; and second optical means, optically disposed for viewing a portion of the projected conjugate image and for re-imaging the viewed portion of the projected conjugate image onto a second conjugate image plane; characterized by:

a. the first object having an array of at least three alignment windows having predetermined relative positions, wherein the predetermined relative positions include spacing, of the alignment windows, of at least the size of the alignment windows plus the intended acquisition range;
b. the second object having an array of at least three corresponding alignment patterns, wherein the corresponding alignment patterns have positions with respect to one another which are counterparts of the predetermined relative positions of the alignment windows of the array of alignment windows;
c. the corresponding alignment patterns having configurations such that different relative portions of each of the alignment patterns is illuminated when there is a misalignment between the image of the windows and the patterns, which relative proportions are a function of the magnitude and direction of the misalignment;
d. having light detection means positioned in the second conjugate image plane for receiving the conjugate image of the illuminated marks and for detecting the proportions of illumination of each of the alignment patterns;
e. having amplifier means responsive to the detected portions of illumination for transforming said detected portions into direction control signals;
f. having control means, coupled to the stage, for moving the stage to position the second object in alignment with the image of the first object in response to the direction control signals;
g. moving the stage to position the second object such that the corresponding alignment patterns are nominally aligned with the image of the alignment windows;
h. viewing an image of the corresponding alignment patterns as illuminated by the image of the alignment windows with the light detection means positioned in the conjugate image plane;
i. deriving direction control signals from the amplifier means; and
j. controlling the control means to move the stage and the corresponding alignment patterns, of the second object, in a manner that substantially results in the nulling of error components in said direction control signals;

so as to position the corresponding alignment patterns, of the second object, in alignment with the image of the alignment windows, of the first object, in real time.

35. Photometric printing apparatus for printing an image from a first object, which first object has non opaque portions, onto a second object, the photometric apparatus including:

a holder for holding the first object; a stage, positionable along X and Y axes, for holding the second object; a light source unit, optically disposed on one side of the holder, for uniformly illuminating the first object with either actinic and/or viewing wavelengths of light; and a unit magnification catadioptric lens, having its aperture defined by a non apertured main mirror, wherein the main mirror is either of the non dioptrically corrected type with a multilayer dielectric coating reflective of the actinic wavelength(s) of light disposed on the front surface of the main mirror and is fabricated of optically transmissive material, or is of the dioptrically corrected type with a multilayer dielectric coating reflective of the actinic wavelength(s) of light disposed on the back surface of the main mirror, and being optically disposed on the other side of the holder and between the holder and the stage, for projecting an image of the non opaque portions of the illuminated first object onto the second object along a forward path and for projecting conjugate images of the second object into a conjugate plane along a conjugate path including transmission in a reverse direction along a portion of the forward path; characterized by:

a second multilayer dielectric coating reflective of the viewing wavelength(s) of light being optically disposed in an annular manner around a central zone of the main mirror in a bifurcated manner with the multilayer dielectric coating reflective of the actinic wavelength(s);
a positive lens grouping, optically disposed behind the central zone of the main mirror, for providing a viewing port to permit viewing of the conjugate image of the second object which results when the second object is illuminated by the projected image of the non opaque portions of the first object;
microscope viewing means, optically disposed beyond the conjugate plane, for viewing a portion of the projected conjugate image and for re-imaging the viewed portion of the projected conjugate image onto a second conjugate image plane;
light detection means positioned in the second conjugate image plane and responsive to an image of alignment mark means of the second object as illuminated by viewing wavelength light imaged from alignment window means of the first object;
amplifier means responsive to output signals from the light detection means for transforming said output signals into direction control signals; and
control means, coupled to the stage, for moving the stage to position the alignment mark means of the second object in alignment with the image of the alignment window means of the first object in response to the direction control signals.

36. Photometric printing apparatus for printing an image from a first object, which first object has non opaque portions, onto a second object, the photometric apparatus including:

a holder for holding the first object;
a stage, positionable along X and Y axes, for holding the second object;
a light source unit, optically disposed on one side of the holder, for uniformly illuminating the first object with either actinic and/or viewing wavelengths of light; and
a unit magnification catadioptric lens, having its aperture defined by a non-apertured main mirror wherein the main mirror is either of the non dioptrically corrected type with a multilayer dielectric coating reflective of the actinic wavelength(s) of light disposed on the front surface of the main mirror and is fabricated of optically transmissive material, or is of the dioptrically corrected type with a multilayer dielectric coating reflective of the actinic wavelength(s) of light disposed on the back surface of the main mirror, and being optically disposed on the other side of the holder and between the holder and the stage, for projecting an image of the non opaque portions of the illuminated first object onto the second object along a forward path and for projecting conjugate images of the second object into a conjugate plane along a conjugate path including transmission in a reverse direction along a portion of the forward path; characterized by:

either the multilayer dielectric coating reflective of the actinic wavelength(s) of light being partially reflective of the viewing wavelength(s) of light or a second multilayer dielectric coating partially reflective of the viewing wavelength(s) of light being optically disposed in a bifurcated manner with the multilayer dielectric coating reflective of the actinic wavelength(s);

a positive lens grouping, optically disposed behind the central zone of the main mirror, for providing a viewing port to permit viewing of the conjugate image of the second object which results when the second object is illuminated by the projected image of the non opaque portions of the first object;

microscope viewing means, optically disposed beyond the conjugate plane, for viewing a portion of the projected conjugate image and for re-imaging the viewed portion of the projected conjugate image onto a second conjugate image plane;

light detection means positioned in the second conjugate image plane and responsive to an image of alignment mark means of the second object as illuminated by viewing wavelength light imaged from alignment window mens of the first object;

amplifier means responsive to output signals from the light detection means for transforming said output signals into direction control signals; and control means, coupled to the stage, for moving the stage to position the alignment mark means of the second object in alignment with the image of the alignment window means of the first object in response to the direction control signals.

37. Photometric printing apparatus for printing an image from a first object, which first object has non opaque portions, onto a second object, the photometric apparatus including:

a holder for holding the first object;

a stage, positionable along X and Y axes, for holding the second object;

a light source unit, optically disposed on one side of the holder, for uniformly illuminating the first object with either actinic and/or viewing wavelengths of light; and a unit magnification catadioptric lens, having its aperture defined by a main mirror, wherein the main mirror is fabricated with a physical aperture in its central zone, and being optically disposed on the other side of the holder and between the holder and the stage, for projecting an image of the non opaque portions of the illuminated first object onto the second object along a forward path and for projecting conjugate images of the second object into a conjugate plane along a conjugate path including transmission in a reverse direction along a portion of the forward path; characterized by:

a positive lens grouping, optically disposed off axis behind the physical aperture of the main mirror wherein a center of an aperture of the positive lens grouping is located on the conjugate path, for providing a viewing port to permit viewing of the conjugate image of the second object which results when the second object is illuminated by the projected image of the non opaque portions of the first object;

microscope viewing means, optically disposed beyond the conjugate plane, for viewing a portion of the projected conjugate image and for re-imaging the viewed portion of the projected conjugate image onto a second conjugate image plane;

light detection means positioned in the second conjugate image plane and responsive to an image of alignment mark means of the second object as illuminated by viewing wavelength light imaged from alignment window means of the first object;

amplifier means responsive to output from the light detection means for transforming said output signals into direction control signals; and control means, coupled to the stage, for moving the stage to position the alignment mark means of the second object in alignment with the image of the alignment window means of the first object in response to the direction control signals.

38. Photometric printing apparatus as in claims 35, 36 or 37 further characterized by:

the first object having at least two arrays of at least three alignment windows each, having predetermined locations and relative positions, wherein the predetermined relative positions include spacing, of the alignment windows, of at least the size of the alignment windows plus the intended acquisition range;

the second object having at least two arrays of at least three corresponding alignment patterns each, wherein the corresponding alignment patterns having locations and positions with respect to one another which are counterparts of the predetermined relative locations and positions of the alignment windows of the arrays of alignment windows;

the corresponding alignment patterns having configurations such that different relative proportions of each of the alignment patterns is illuminated when there is a misalignment between the image of the windows and the patterns, which relative proportions are a function of the magnitude and direction of the misalignment; and utilizing two sets of the microscope viewing means, the light detection means, an the amplifier means.

39. A method for use in calibrating a photometric apparatus of the type for printing an image of a first object onto a second object, including:

a holder for holding the first object;

a stage, positionable along X and Y axes relative to the image of the first object and including means for generating a stage reference when said generating means are illuminated by the image of non opaque regions of the first object, for holding the second object;

a light source unit, optically disposed on one side of the holder, for uniformly illuminating the first object with either actinic and/or viewing wavelengths of light; and a unit magnification catadioptric lens optically disposed on the other side of the holder and between the holder and the stage, or projecting an image of the non opaque portions of the illuminated first object onto the second object along a forward path and for projecting conjugate images of the second object into a conjugate plane along a conjugate path including transmission in a reverse direction along a portion of the forward path; characterized by:

a. having a positive lens grouping, optically disposed behind a central zone of the main mirror, which central zone is at least partially transmissive of the viewing wavelength(s) of light, for providing a viewing port to permit viewing of the conjugate image of the second object which results when the second object is illuminated by the projected image of the non opaque portions of the first object;

b. having microscope viewing means, optically disposed beyond the conjugate plane, for viewing a portion of the projected conjugate image and for re-imaging the viewed portion of the projected conjugate image onto a second conjugate image plane;

c. having light detection means positioned in the second conjugate image plane and responsive to an image of alignment mark means of the second object or the stage reference as illuminated by viewing wavelength light imaged from alignment window means of the first object;

d. having amplifier means responsive to output signals from the light detection mens for transforming said output signals into direction control signals;

e. having control means, coupled to the stage, for moving the stage to position the alignment mark means of the second object or the stage reference in alignment with the image of the alignment window means of the first object in response to error components of the direction control signals;

f. the first object having first and second alignment window means in predetermined locations;

g. utilizing two sets of the microscope viewing means, the light detection means, and the amplifier means;

h. moving the stage to position the generating means such that the alignment reference is nominally aligned with the image of the first alignment window means;

i. determining the position of the stage along the X and Y axes to obtain a nominal x,y address of the image of the first alignment window means;

j. viewing an image of the alignment reference with the light detection means wherein said alignment reference is illuminated by the image of the first alignment window means;

k. deriving direction control signals from the viewed image of the alignment reference;

l. utilizing the control means to move the stage and the alignment reference in a manner that substantially results in the nulling of any error components in said direction control signals;

m. determining $\delta x'$ and $\delta y'$ offset values between the current position of the stage and the nominal x,y address of the image of the first alignment window means;

n. moving the stage to position the generating means such that the alignment reference is nominally aligned with the image of the second alignment window means;

o. determining the position of the stage along the X and Y axes to obtain the nominal x,y address of the image of the second alignment window means;

p. viewing the image of the alignment reference as illuminated by the image of the second alignment window means with the light detection means;

q. deriving direction control signals from the viewed image of the alignment reference;

r. utilizing the control means to move the stage and the alignment reference in a manner that substantially results in the nulling of any error components in said direction control signals;

s. determining $\delta x''$ and $\delta y''$ offset values between the current position of the stage and the nominal x,y address of the image of the second alignment window means; and t. designating offset and rotated U and V axes of motion according to the formulas $$u = (x - \delta x)\cos\phi + (y - \delta y)\sin\phi \text{ and}$$

$$v = (y - \delta y)\cos\phi - (x - \delta x)\sin\phi,$$

where $\delta x$, $\delta y$ and $\phi$ are determined by the formulas $$\delta x = (\tfrac{1}{2})(\delta x' + \delta x''),$$

$$\delta y = (\tfrac{1}{2})(\delta y' + \delta y'') \text{ and}$$

$$\phi = \arcsin(\delta y' - \delta y'')/w$$

where w is the normal difference in the X addresses of the images of the first and second alignment window means;

so as to calibrate the photometric printing apparatus.

40. The method of claim 39, further for photometrically printing a plurality of levels of microcircuitry including a first level in a plurality of regions of the second object, further including:

the second object being positioned on rotational means coupled to the stage; the control means being coupled to the rotational means; and the second object being a semiconductive wafer, the method being further characterized by:

u. coupling the control means to the rotational means, further for positioning the alignment mark means of the second object (the semiconductive wafer) in alignment with the image of the alignment window means of the first object in response to other error components of the directional control signals;

v. coating the semiconductive wafer with a photosensitive emulsion;

w. photometrically printing the first level of microcircuitry on the semiconductive wafer, including the steps of (i) utilizing a first level reticle as the first object, said first level reticle having windows suitable for printing alignment mark means on the wafer surface wherein each printed region of the semiconductive wafer will have first and second wafer alignment marks in predetermined locations corresponding to the first and second alignment window means of the reticle;

(ii) moving the stage in a serpentine fashion under the unit magnification lens;
(iii) stopping at each region of the semiconductive wafer; and
(iv) making an exposure;
x. processing the semiconductive wafer, including the step of etching the wafer alignment marks into the surface of the semiconductive wafer, or the step of etching the area immediately surrounding the wafer alignment marks into the surface of the semiconductive wafer;
y. coating the semiconductive wafer with a photosensitive emulsion;
z. using the next higher level reticle as the first object, said next higher level reticle having first and second alignment window means;
aa. positioning the processed semiconductive wafer on the rotational means coupled to the stage;
bb. moving the stage into a position of nominal coincidence of the image of the higher level reticle and a region of the processed semiconductive wafer in a first portion of the semiconductive wafer;
cc. moving the stage to align the wafer alignment marks to a position of "best fit" with the images of the first and second alignment window means without rotation of the rotational means;
dd. determining offset values $\delta u_a$ and $\delta v_a$ between the position of nominal coincidence and the position of "best fit" of step "cc.";
ee. moving the stage into a position of nominal coincidence of the image of the higher level reticle and a region of the processed semiconductive wafer in a second portion of the semiconductive wafer having a different U address;
ff. moving the stage to align the wafer alignment marks to a position of "best fit" with the images of the first and second alignment window means without rotation of the rotational means;
gg. determining offset values $\delta u_b$ and $\delta v_b$ between the position of nominal coincidence and the position of "best fit" of step "ff.";
hh. determining a set of best average alignment offsets according to the formulas $$\delta u = (\delta u_a + \delta u_b),$$

$$\delta v = (\delta v_a + \delta v_b) \text{ and}$$

$$\delta \psi = \arcsin (\delta v_b - \delta v_a)/ l$$

where l is the nominal difference in the U addresses of the regions on the first and second portions of the semiconductive wafer;
ii. moving the stage in a serpentine fashion under the unit magnification catadioptric lens;
jj. stopping at each region of the semiconductive wafer at a nominal addresses of the region modified by the set of best average alignment offsets determined in step "hh.";
kk. making an exposure;
ll. processing the semiconductive wafer; and
mm. repeating the steps of "y." through "ll." for each higher level of microcircuitry to be printed;
so as to photometrically print the plurality of levels of microcircuitry, including the first level in the plurality of regions of the semiconductive wafer.

41. The method of claim 39, further for photometrically printing a plurality of levels of microcircuitry including a first level in a plurality of regions of the second object, further including:
the second object being positioned on rotational means coupled to the stage; the control means being coupled to the rotational means; and the second object being a semiconductive wafer, the method being further characterized by:
u. coupling the control means to the rotational means, further for positioning the alignment mark means of the second object (the semiconductive wafer) in alignment with the image of the alignment window means of the first object in response to other error components of the directional control signals;
v. coating the semiconductive wafer with a photosensitive emulsion;
w. photometrically printing the first level of microcircuitry on the semiconductive wafer, including the steps of
(i) utilizing a first level reticle as the first object, said first level reticle having windows suitable for printing alignment mark means on the wafer surface wherein each printed region of the semiconductive wafer will have first and second wafer alignment marks in predetermined locations corresponding to the first and second alignment window means of the reticle;
(ii) moving the stage in a serpentine fashion under the unit magnification lens;
(iii) stopping at each region of the semiconductive wafer; and
(iv) making an exposure;
x. processing the semiconductive wafer, including the step of etching the wafer alignment marks into the surface of the semiconductive wafer, or the step of etching the area immediately surrounding the wafer alignment marks into the surface of the semiconductive wafer;
y. coating the semiconductive wafer with a photosensitive emulsion;
z. using the next higher level reticle as the first object, said next higher level reticle having first and second alignment window means;
aa. positioning the processed semiconductive wafer on the rotational means coupled to the stage;
bb. moving the stage into a position of nominal coincidence of the image of the higher level reticle and a region of the processed semiconductive wafer in a first portion of the semiconductive wafer;
cc. moving the stage and rotating the rotational means to align the wafer alignment marks of the region to a position of alignment with the images of the first and second alignment window means of the higher level reticle;
dd. determining the offset values, $\delta u$, $\delta v$ between the position of nominal coincidence and the position of alignment of step "cc.";
ee. making an exposure;
ff. modifying a succeeding position of nominal coincidence of the image of the higher level reticle and an adjacent region of the processed semiconductive wafer by the $\delta u$, $\delta v$ and offsets of step "dd.";
gg. moving the stage into the modified position of nominal coincidence of the image of the higher level reticle and the adjacent region of the processed semiconductive wafer;
hh. repeating the steps of "cc." through "gg." until the semiconductive wafer is completely exposed;
ii. processing the semiconductive wafer; and
jj. repeating the steps of "y." through "ii." for each higher level of microcircuitry to be printed.
so as to photometrically print the plurality of levels of microcircuitry, including the first level, in the plurality of regions of the semiconductive wafer.

* * * * *